United States Patent
Kaneko et al.

(10) Patent No.: US 9,166,057 B2
(45) Date of Patent: Oct. 20, 2015

(54) SEMICONDUCTOR DEVICE HAVING THE BOTTOM GATE TYPE TRANSISTOR FORMED IN A WIRING LAYER

(71) Applicant: RENESAS ELECTRONICS CORPORATION, Kanagawa (JP)

(72) Inventors: Kishou Kaneko, Kanagawa (JP); Hiroshi Sunamura, Kanagawa (JP); Yoshihiro Hayashi, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/138,162

(22) Filed: Dec. 23, 2013

(65) Prior Publication Data

US 2014/0183525 A1    Jul. 3, 2014

(30) Foreign Application Priority Data

Dec. 27, 2012 (JP) .................................. 2012-286074

(51) Int. Cl.
| | |
|---|---|
| H01L 29/10 | (2006.01) |
| H01L 21/70 | (2006.01) |
| H01L 23/48 | (2006.01) |
| H01L 21/00 | (2006.01) |
| H01L 29/786 | (2006.01) |
| H01L 27/12 | (2006.01) |

(52) U.S. Cl.
CPC .......... *H01L 29/7869* (2013.01); *H01L 27/124* (2013.01); *H01L 27/1225* (2013.01)

(58) Field of Classification Search
CPC ..................... H01L 29/66969; H01L 29/7869; H01L 29/66; H01L 29/786; H01L 29/78669; H01L 29/78678; H01L 27/1251; H01L 27/0688; H01L 27/1225; H01L 27/1248; H01L 29/69
USPC ............ 257/43, 414, 758; 438/104, 585, 591, 438/622
See application file for complete search history.

(56) References Cited

U.S. PATENT DOCUMENTS

| | | | |
|---|---|---|---|
| 2008/0122098 A1* | 5/2008 | Kajimoto et al. ............. | 257/759 |
| 2008/0157214 A1* | 7/2008 | Nakajima et al. ............. | 257/369 |
| 2010/0148171 A1* | 6/2010 | Hayashi et al. ................ | 257/43 |
| 2010/0163862 A1* | 7/2010 | Yang et al. ...................... | 257/43 |
| 2011/0101339 A1* | 5/2011 | Yamazaki et al. .............. | 257/43 |
| 2011/0156026 A1* | 6/2011 | Yamazaki et al. .............. | 257/43 |
| 2011/0309353 A1* | 12/2011 | Kaneko et al. ................. | 257/43 |

* cited by examiner

*Primary Examiner* — Long K Tran
*Assistant Examiner* — Dzung Tran
(74) *Attorney, Agent, or Firm* — Young & Thompson

(57) ABSTRACT

The present invention makes it possible to increase the selectivity of a gate insulation film in an active element formed in a wiring layer.
A semiconductor device according to the present invention has a bottom gate type transistor using an antireflection film formed over an Al wire in a wiring layer as a gate wire.

17 Claims, 18 Drawing Sheets

PRIOR ART

SEMICONDUCTOR DEVICE HAVING THE BOTTOM GATE TYPE TRANSISTOR FORMED IN A WIRING LAYER

CROSS-REFERENCE TO RELATED APPLICATIONS

The disclosure of Japanese Patent Application. No. 2012-286074 filed on Dec. 27, 2012 including the specification, drawings and abstract is incorporated herein by reference in its entirety.

BACKGROUND

The present invention relates to a semiconductor device, in particular to a layout structure of a bottom gate type MIS (Metal Insulator Semiconductor) formed in a wiring layer.

A technology of forming an active element having switch function and rectification function in a wiring layer is known like a semiconductor device described in Japanese Unexamined Patent Publication No. 2010-141230 (refer to Patent Literature 1). By forming an active element in a wiring layer, it is possible to change the function of a whole semiconductor device significantly without changing the layout of a semiconductor element formed over a semiconductor substrate.

FIG. 1 is a view showing an example of the structure of a semiconductor device described in Patent Literature 1. In FIG. 1, a semiconductor device described in Patent Literature 1 has a wiring layer 900 and a semiconductor element 910 formed over a semiconductor substrate. The wiring layer 900 has an insulation film 921 formed over a diffusion prevention film 901 and a wire 904 and a via 903 embedded in the insulation film 921. A barrier metal not shown in the figure is formed at an interface between the wire 904 and the via 903 and other structures (the insulation film 921, the diffusion prevention film 901, and the wire 904). A diffusion prevention film 911 is formed over the wiring layer 900 and an insulation film 922 and a wire 916 and a via 915 embedded in the insulation film 922 are formed over the diffusion prevention film 911. The semiconductor element 910 has a gate electrode 902, a gate insulation film 911, and a semiconductor layer 912. The semiconductor layer 912 is formed over the gate insulation film 911 and coupled to a wire 914 through a via 913. The gate electrode 902 is formed under the gate insulation film 911 in the wiring layer 900. A barrier metal not shown in the figure is formed at an interface between the wire 914 and the via 913 and other structures (the insulation film 922 and the semiconductor layer 912).

PREVIOUS TECHNICAL LITERATURE

Patent Literature

[Patent Literature 1]
Japanese Unexamined Patent Publication No. 2010-141230

SUMMARY

Cu has a high diffusion coefficient and is likely to diffuse in an interlayer insulation film and hence, when a Cu wiring process is used, it is necessary to form a barrier metal and a diffusion prevention film (also called a wiring cap insulation film) between wiring layers. In a semiconductor device described in Patent Literature 1, a bottom gate type transistor (also called a back gate type transistor or an inverted type transistor) using a Cu wire as a gate wiring 902 is materialized by using a diffusion prevention film formed over a wiring layer 900 as a gate insulation film 911.

In a Cu wiring process however, it is necessary to form a barrier metal and a diffusion prevention film capable of preventing the diffusion of Cu as stated above. For the reason, when an active element is formed in a wiring layer by using a Cu wiring process, it is concerned that a material constituting a gate insulation film is limited to a diffusion prevention film capable of preventing the diffusion of Cu. Consequently, it is desired to increase the selectivity of a material usable as a gate insulation film of a bottom gate type transistor formed in a wiring layer.

A semiconductor device according to the present embodiment has a bottom gate type transistor that uses an antireflection film formed over an Al wire in a wiring layer as a gate wire.

The present invention makes it possible to increase the selectivity of a gate insulation film in an active element formed in a wiring layer.

DETAILED DESCRIPTION

Figure 1:
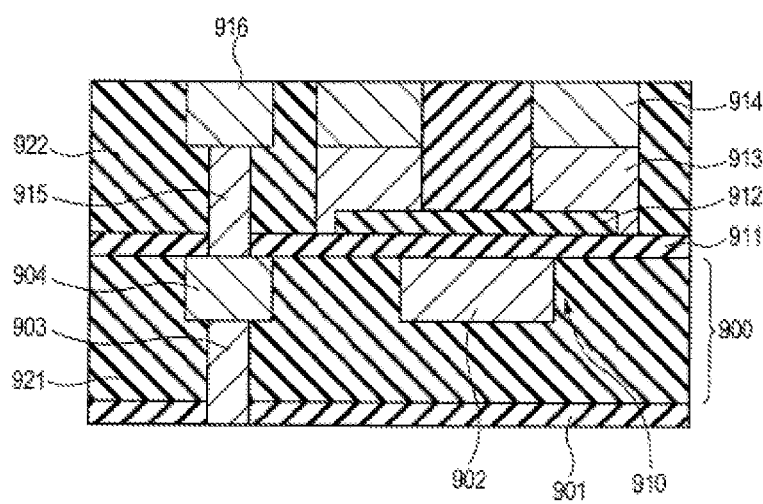
FIG. 1 is a view showing the configuration of a semiconductor device described in Japanese Unexamined Patent Publication No. 2010-141230.

Embodiments according to the present invention are hereunder explained in reference to attached drawings. In the drawings, identical or similar reference symbols represent identical, similar, or equivalent components.

1. First Embodiment

Figure 2:
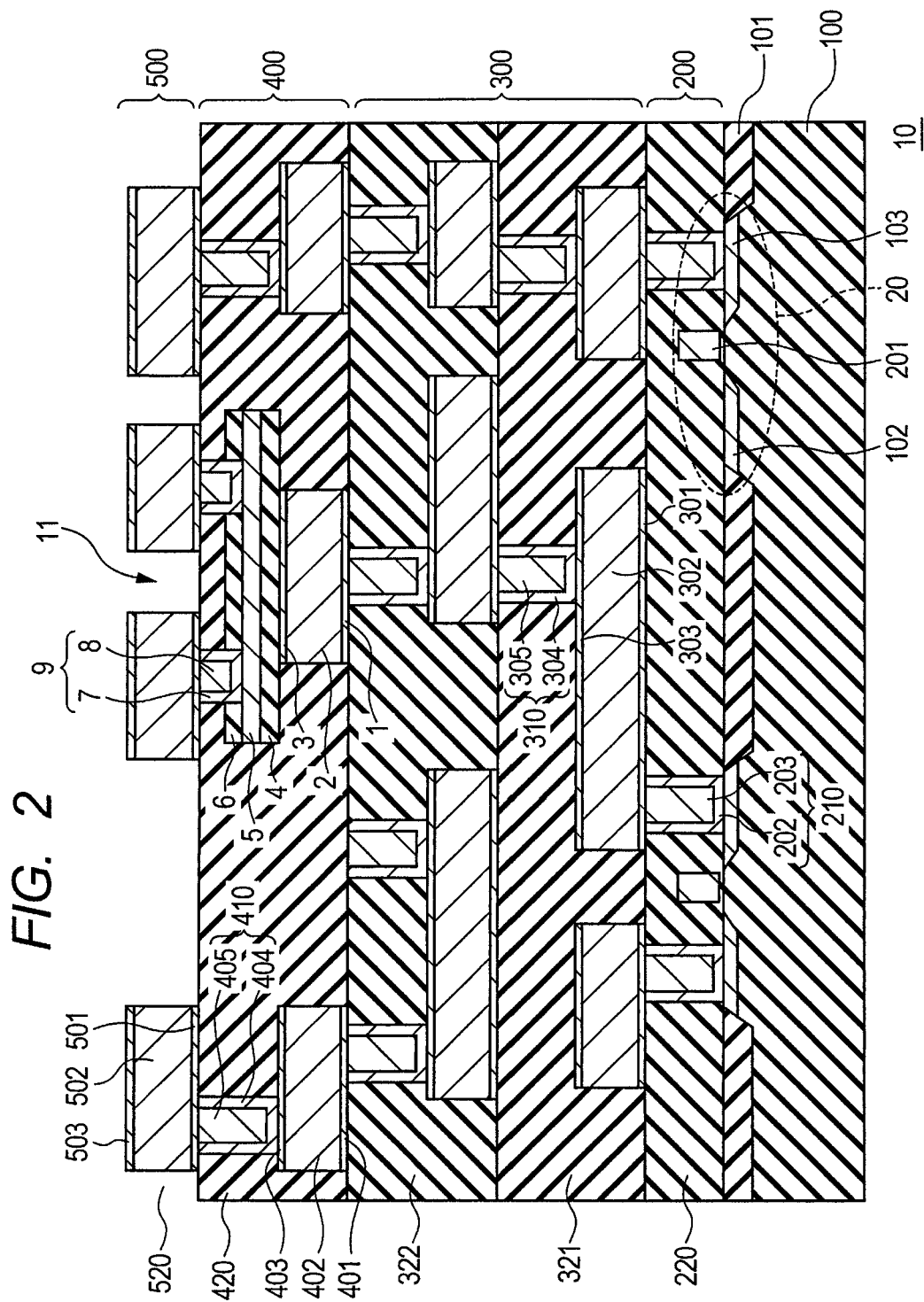
FIG. 2 is a view showing an example of the configuration of a semiconductor device according to First Embodiment.
Figure 3:
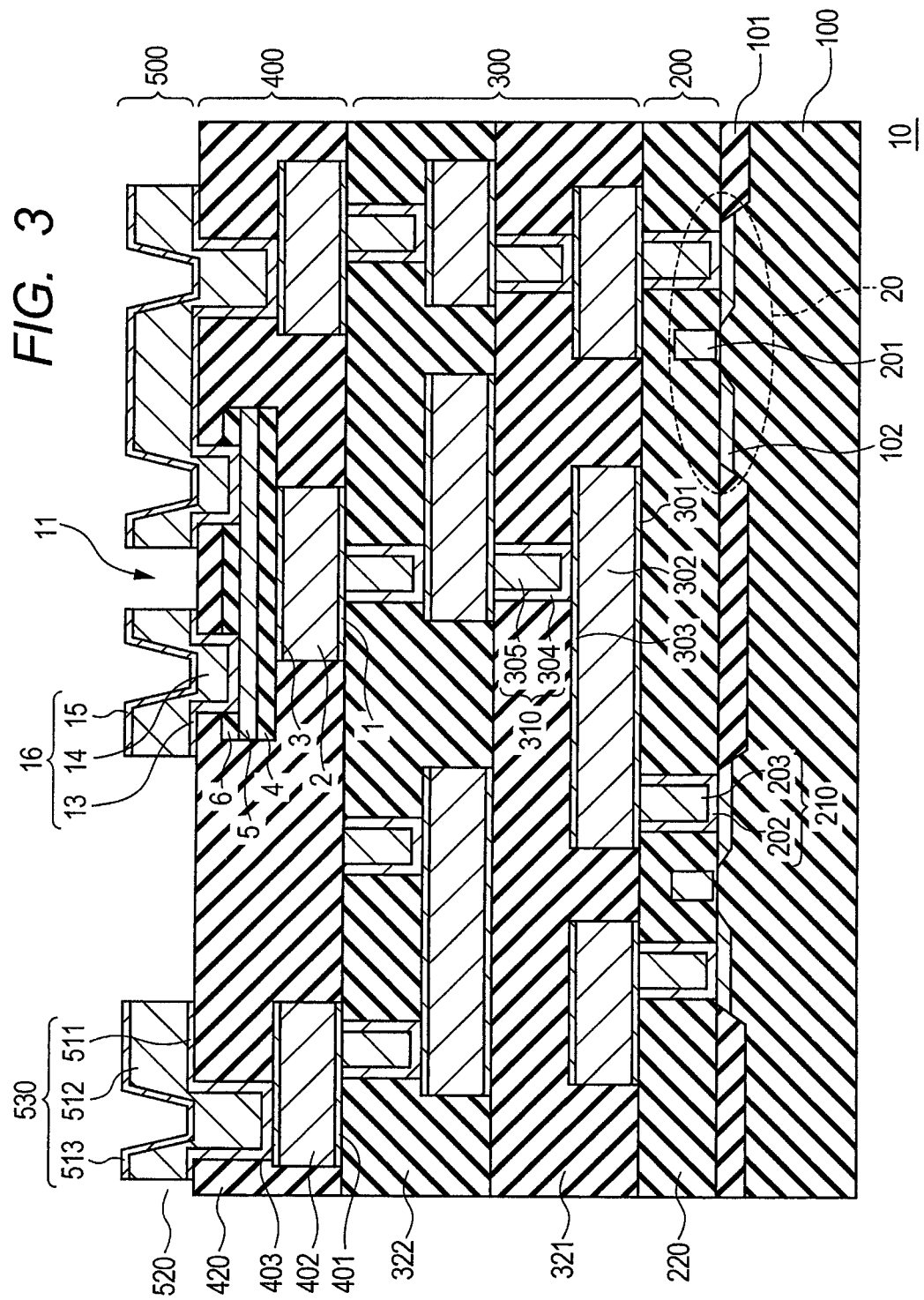
FIG. 3 is a view showing another example of the configuration of a semiconductor device according to First Embodiment.

The configuration of a semiconductor device 10 according to First Embodiment of the present invention is explained in detail in reference to FIGS. 2 and 3. FIG. 2 is a view showing an example of the configuration of a semiconductor device according to First Embodiment. In FIG. 2, a semiconductor device 10 according to First Embodiment has an underlying logic element 20 formed over a substrate 100, a plurality of wiring layers 200, 300, 400, and 500, and a bottom gate type transistor 11 (also called a wiring layer active element) formed in the wiring layer 400.

In the substrate 100 (preferably a monocrystal semiconductor substrate, for example an Si substrate), the underlying logic element 20 separated into parts by an element isolation layer 101 is formed. As an example here, a transistor having a gate wire 201, a source diffusion layer 102, and a drain diffusion layer 103 is shown as the underlying logic element 20. Specifically, a diffusion region (the source diffusion layer 102 and the drain diffusion layer 103) into which impurities (n-type impurities for example) are injected is formed between the element isolation layer 101 in the substrate 100 (a Psub substrate for example). The gate wire 201 is formed in the upper layer at a channel region between the source diffusion layer 102 and the drain diffusion layer 103 through an interlayer insulation film 220.

The first wiring layer 200 is formed over the underlying logic element 20. The underlying logic element 20 is coupled to another element, a power source, or the like through the first wiring layer 200. For example, the first wiring layer 200 has a contact 210 coupling the underlying logic element 20 to the second wiring layer 300 and a wire not shown in the figure. The contact 210 includes a contact plug 203 and a barrier metal 202. For example, a W (tungsten) plug is preferably used as the contact plug 203 and the barrier metal 202 exemplified by TiN is formed at the interface.

The second wiring layer 300 is formed over the first wiring layer 200. Each of the wiring layers 200, 300, 400, and 500 may have a structure comprising a plurality of layers and here the second wiring layer 300 comprises two interlayer insulation films 321 and 322. A wire 302 and a via 310 are formed in each of the interlayer insulation films 321 and 322. Antireflection films 301 and 303 are formed over the top face and the bottom face respectively at the interface between the wire 302 and each of the interlayer insulation films 321 and 322. The antireflection film 301 however may not be formed. The via 310 includes a via plug 305 and a barrier metal 304. For example, a W (tungsten) plug is preferably used as the via plug 305 and the barrier metal 304 exemplified by TiN is formed at the interface.

The third wiring layer 400 is formed over the second wiring layer 300. The third wiring layer 400 has a wire 402, a via 410, and the bottom gate type transistor 11 formed in an interlayer insulation film 420. Antireflection films 401 and 403 are formed over the top face and the bottom face respectively at the interface between the wire 402 and the interlayer insulation film 420. The antireflection film 401 however may not be formed. The via 410 includes a via plug 405 and a barrier metal 404. For example, a W (tungsten) plug is preferably used as the via plug 405 and the barrier metal 404 exemplified by TiN is formed at the interface.

The bottom gate type transistor 11 has a wire 2, antireflection films 1 and 3, a gate insulation film 4, and a semiconductor layer 5 and is coupled to a wire 502 in the fourth wiring layer 500 through a barrier metal 7 and a contact plug 8. The wire 2 and the antireflection films 1 and 3 comprise a material identical to the wire 402 and the antireflection films 401 and 403 in the third wiring layer 400. The antireflection film 1 however may not be formed.

The wiring layers 200, 300, 400, and 500 in the present embodiment may preferably be formed through an Al wiring process. That is, the wires 2, 302, 402, and 502 comprise Al or a material containing Al. Further, a material having a power close to an Al wire (for example, TiN or a laminated material of TiN/Ti) is preferably used as the antireflection films 3, 301, 303, 401, 403, 501, and 503. The gate insulation film 4, the semiconductor layer 5, and a hard mask insulation film 6 are stacked in sequence from the lower layer over the antireflection film 3. It is possible to use an oxide film or a nitride film of various structures as the gate insulation film 4 by using the antireflection film 3 as a gate electrode. For example, the gate insulation film 4 may comprise an insulation film containing any one of SiN, $SiO_2$, SiCN, SiON, SiCOH, $Al_2O_3$ ($Al_xO_y$), and $Ta_2O_5$ ($Ta_xO_y$). Otherwise the gate insulation film 4 may contain a High-k material (for example, $ZrO_2$, $HfO_2$, $La_2O_3$, or $LaAlO_3$) having a high dielectric constant. Further, the gate insulation film 4 may comprise a stacked structure (for example, $AlO_2/SiO_2$, $SiO_2/SiN$, $Al_2O_3/SiN$, or $Al_2O_3/SiO_2/SiN$) formed by stacking the above insulation film and the above High-k material. In the present embodiment therefore, since the antireflection film 3 used in the Al wiring process is used as a gate wire, it is possible to select a material usable as the gate insulation film 4 without taking the diffusion of Al into consideration.

In a semiconductor device described in Patent Literature 1, since a Cu wire is used as a gate wire, a wiring cap insulation film for the Cu wire is used as a gate insulation film. In such a structure, it is necessary to use a wiring cap insulation film (for example, SiN or SiCN) for preventing a Cu wire from diffusing as a gate insulation film and hence it is concerned that an applicable gate insulation film is limited. On the other hand, in a semiconductor device 10 according to the present embodiment, it is not necessary to consider the diffusion of a gate electrode and hence many materials can be used as the gate insulation film 4. In the present embodiment therefore, in the case where transistor characteristics (Ion-Ioff characteristic (correlation between on-state current and off-state current), threshold voltage characteristics, etc.) and device reliability (BTI: Bias Temperature Instability, hysteresis characteristics, etc.) deteriorate because of the gate insulation film 4, it is possible to improve the characteristics by changing the material and the laminated structure of the gate insulation film 4. That is, the present invention can make it possible to improve the process margin of a bottom gate type active element formed in a wiring layer.

A channel region is formed at an inter-region (between a source region and a drain region) to which a contact 9 is coupled in the semiconductor layer 5. The region (the source region or the drain region not shown in the figure) to which the contact 9 is coupled in the semiconductor layer 5 is formed by introducing oxygen defects or impurities into the semiconductor layer 5. An oxide semiconductor material is preferably used for the semiconductor layer 5. Here, when the semiconductor layer 5 functions as a P-type semiconductor layer, the semiconductor layer 5, as a P-channel material, includes any one of SnO, NiO, ZnO, Cu$_2$O, and NiO or may include a laminated structure of those. Meanwhile, when the semiconductor layer 5 functions as an N-type semiconductor layer, the semiconductor layer 5, as an N-channel material, includes any one of InGaZnO, ZnO, InZnO, InHfZnO, those being materials of a ZnO system, SnO$_2$, and CuO or may include a laminated structure of those. For example, a laminated film comprising IGZO/Al$_2$O$_3$/IGZO/Al$_2$O$_3$ is preferably used as the semiconductor layer 5.

The hard mask insulation film 6 used for processing the semiconductor layer 5 and the gate insulation film 4 is formed over the semiconductor layer 5. For example, SiN, SiO$_2$, SiCOH, or TiN is preferably used as the hard mask insulation film 6.

The contact 9 penetrating into the hard mask insulation film 6 at a given location and reaching a wire (here, the antireflection film 501) formed in the fourth wiring layer 500 is formed over the semiconductor layer 5. The contact 9 includes the contact plug 8 and the barrier metal 7. For example, a W (tungsten) plug is preferably used as the contact plug 8 and the barrier metal 7 exemplified by TiN is formed at the interface.

The fourth wiring layer 500 is formed over the third wiring layer 400. A source and a drain (contact 9) of the bottom gate type transistor 11 are coupled to another element, a power source, and the like through the fourth wiring layer 500. The fourth wiring layer 500 has the wire 502 formed in an interlayer insulation film 520. The antireflection films 501 and 503 are formed over the top face and the bottom face at the interface between the wire 502 and the interlayer insulation film 520. The antireflection film 501 however may not be formed.

FIG. 3 is a view showing another example of the configuration of a semiconductor device according to First Embodiment. Whereas a contact 9 of a W/TiN structure is used as a source contact and a drain contact of a bottom gate type transistor 11 in the example shown in FIG. 2, a wire in a fourth wiring layer 500 is coupled to a semiconductor layer 5 by embedding a wiring material into a via hole in the example shown in FIG. 3. The configuration of a semiconductor device 10 shown in FIG. 3 is hereunder explained on the parts different from the example shown in FIG. 2.

The structure of a semiconductor device 10 shown in FIG. 3 is the same as the structure shown in FIG. 2 on the parts from a substrate 100 to a semiconductor layer 5 in a third wiring layer 400. In FIG. 3, an embedded wire 16 reaching a fourth wiring layer 500 through a given region in a hard mask insulation film 6 is formed over the semiconductor layer 5. The embedded wire 16 shows a laminated structure comprising an antireflection film 13, a wire 14 (Al wire), and an antireflection film 15 in sequence from the lower layer. The antireflection films 13 and 15 show a laminated structure of TiN/Ti for example.

Successively, an example of a method for manufacturing a semiconductor device 10 according to First Embodiment shown in FIG. 2 or 3 is explained in reference to FIGS. 4A to 4E.

Firstly, an example of a method for manufacturing a semiconductor device 10 shown in FIG. 2 is explained.

Figure 4A:
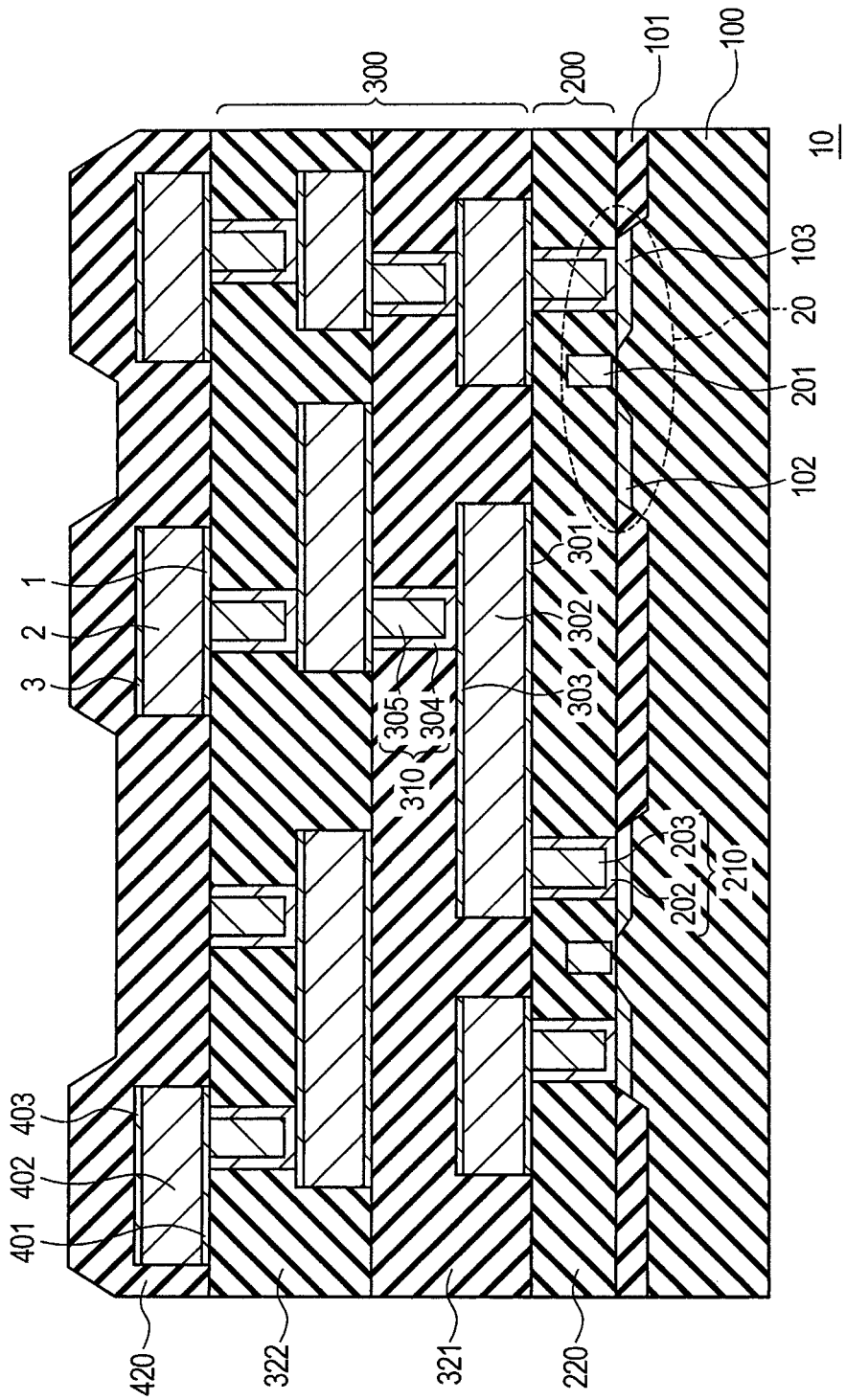
FIG. 4A is a view showing an example of a method for manufacturing a semiconductor device shown in FIG. 2 or 3.

In FIG. 4A, an underlying logic element 20 formed in an Si substrate is formed through an ordinary semiconductor manufacturing process (for example, forming a diffusion layer by injecting impurities into a substrate 100 and forming a gate wire by masking and etching). An interlayer insulation film 220 is formed over the underlying logic element 20, flattening treatment is applied by CMP (Chemical Mechanical Polishing) or the like, and wiring layers 200 and 300 are formed further thereover through an Al wiring process. An ordinary Al wiring process can be used also for the wiring layers 200 and 300. For example, after a film is formed with a laminated structure material by a sputtering method, a CVD (Chemical Vapor Deposition) method, a coating method, or the like, a wire (antireflection film 301/wire 302/antireflection film 303) of a laminated structure, a via 310, or a contact 210 is formed through patterning treatment by masking and etching. Here for example, an Al wire (TiN/Al/TiN), a via (W/TiN), or a contact (W/TiN) of a laminated structure is formed. Interlayer insulation films 220, 321, and 322 (for example SiO$_2$) are formed over the formed wire, contact, and via, flattening treatment is applied by CMP, and the wiring layers 200 and 300 are formed.

Figure 4B:
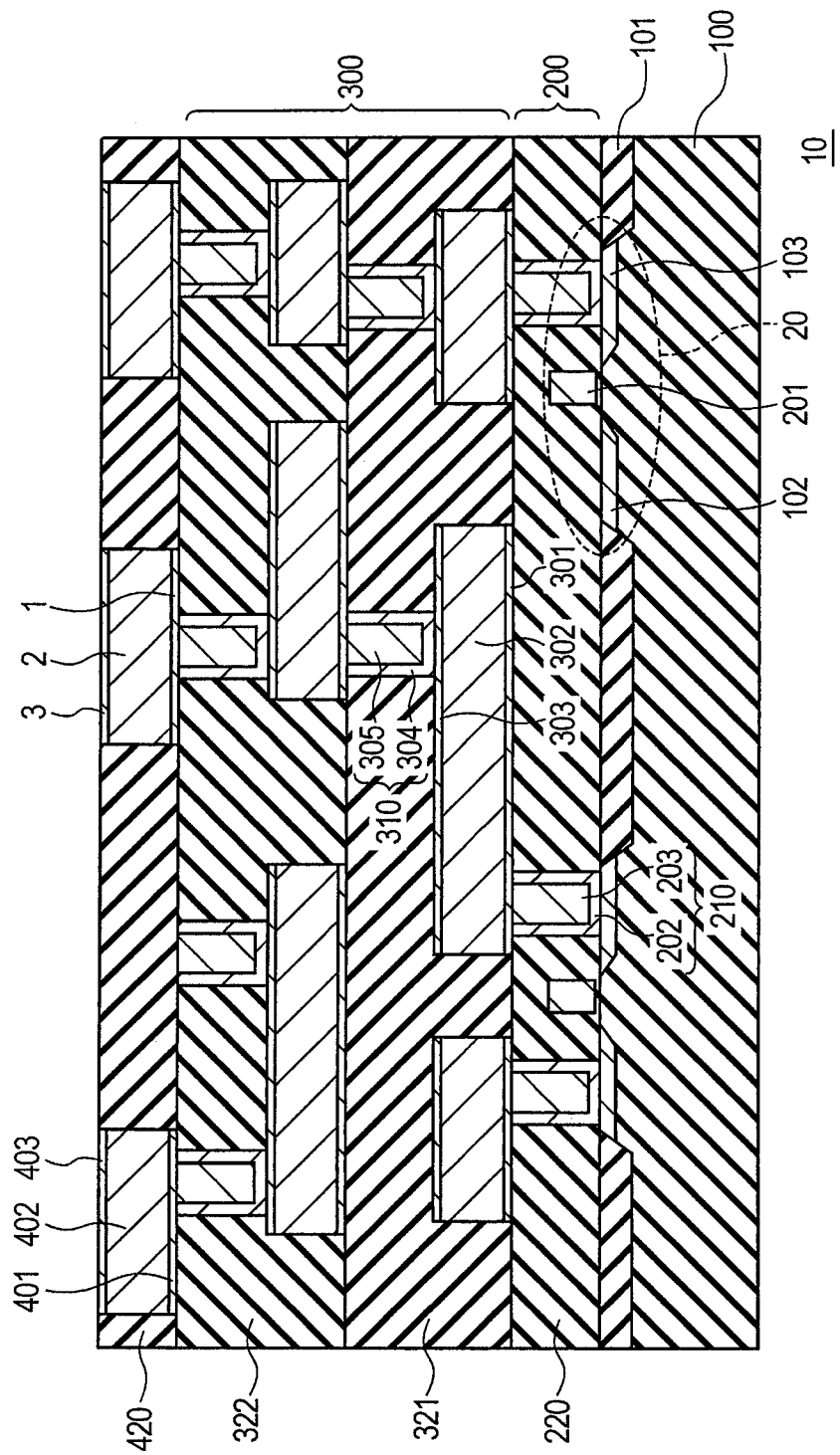
FIG. 4B is a view showing an example of a method for manufacturing a semiconductor device shown in FIG. 2 or 3.

In FIG. 4A, after a film of a laminated structure is formed with a wiring material in the same manner as the above wiring process over the second wiring layer 300, a laminated wire (antireflection film 401/wire 402/antireflection film 403) and a gate wire of a laminated structure (antireflection film 1/wire 2/antireflection film 3) are formed by patterning treatment. Here for example, an Al wire of a laminated structure (for example TiN/Al/TiN) is formed as the laminated wire (antireflection film 401/wire 402/antireflection film 403) and the gate wire (antireflection film 1/wire 2/antireflection film 3). An interlayer insulation film 420 (for example SiO$_2$) is formed over the laminated wire (antireflection film 401/wire 402/antireflection film 403) and the gate wire (antireflection film 1/wire 2/antireflection film 3) and the interlayer insulation film 420 is removed partially and flattened by CMP as shown in FIG. 4B. As a result, the antireflection films 3 and 403 (TiN) are exposed on the outermost surface.

Figure 4C:
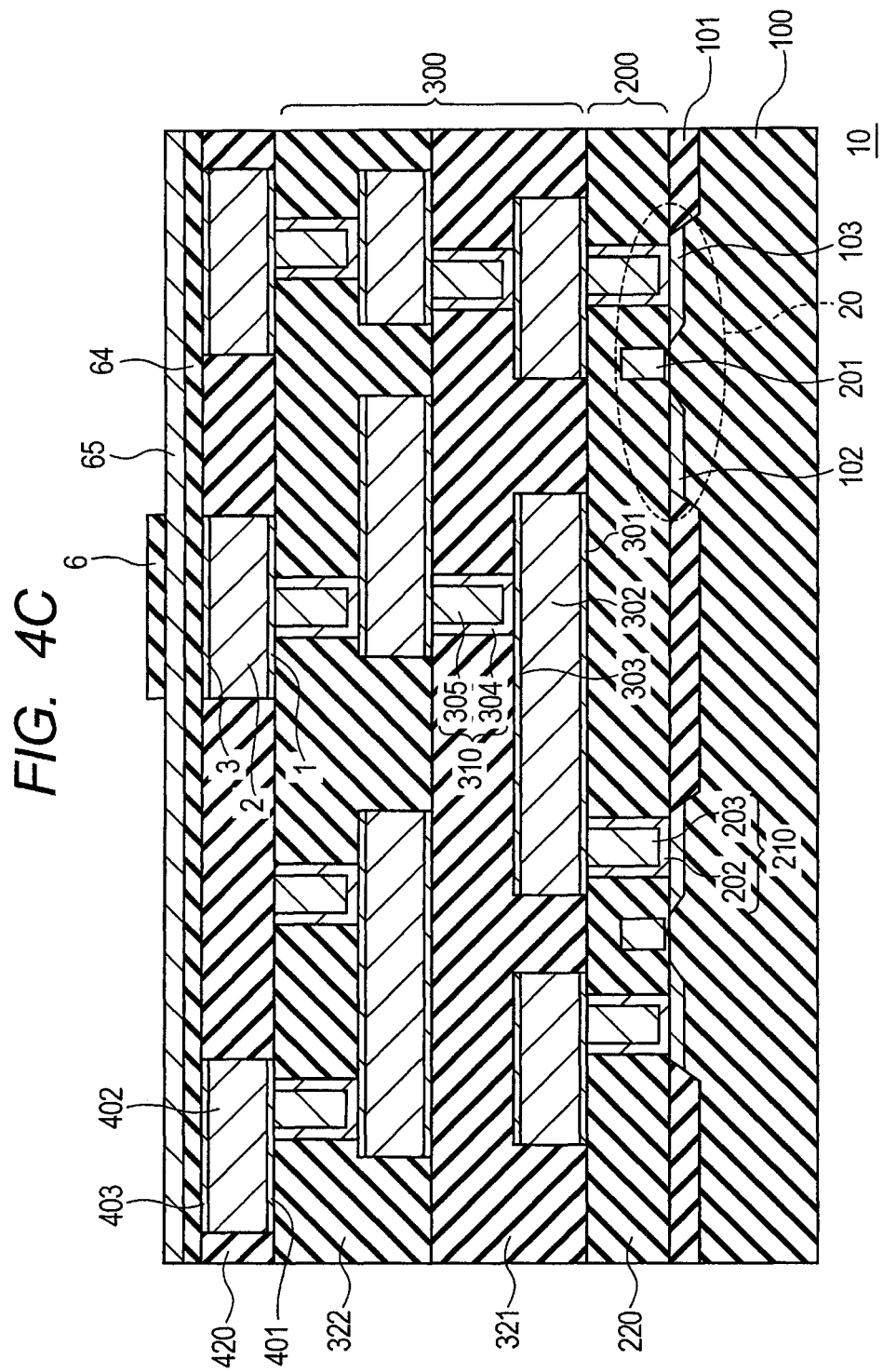
FIG. 4C is a view showing an example of a method for manufacturing a semiconductor device shown in FIG. 2 or 3.

In FIG. 4C, insulation films 64 and 65 are formed over the surface of the second wiring layer 300 including the antireflection films 3 and 403 in sequence from the lower layer by a sputtering method, a CVD method, a coating method, or the like. The insulation film 64 comes to be a gate insulation film 4 through a subsequent etching process and hence comprises a material identical to the aforementioned gate insulation film 4. Likewise, the insulation film 65 comes to be a semiconductor layer 5 through a subsequent etching process and hence comprises a material identical to the aforementioned semiconductor layer 5.

Successively, a pattern-formed hard mask insulation film 6 is formed over the insulation film 65. A silicon-contained dielectric material (for example, any one of SiN, SiO$_2$, and SiCOH or a laminated structure of those) is preferably used as the hard mask insulation film 6. Here, when the semiconductor layer 5 is an oxide semiconductor such as InGaZnO, InZnO, ZnO, ZnAlO, or ZnCuO for example, it is desirable to stabilize the oxidation state of the surface of the semiconductor layer 5 by plasma treatment that introduces an oxidizing gas such as N$_2$O before the hard mask insulation film 6 is formed.

Figure 4D:
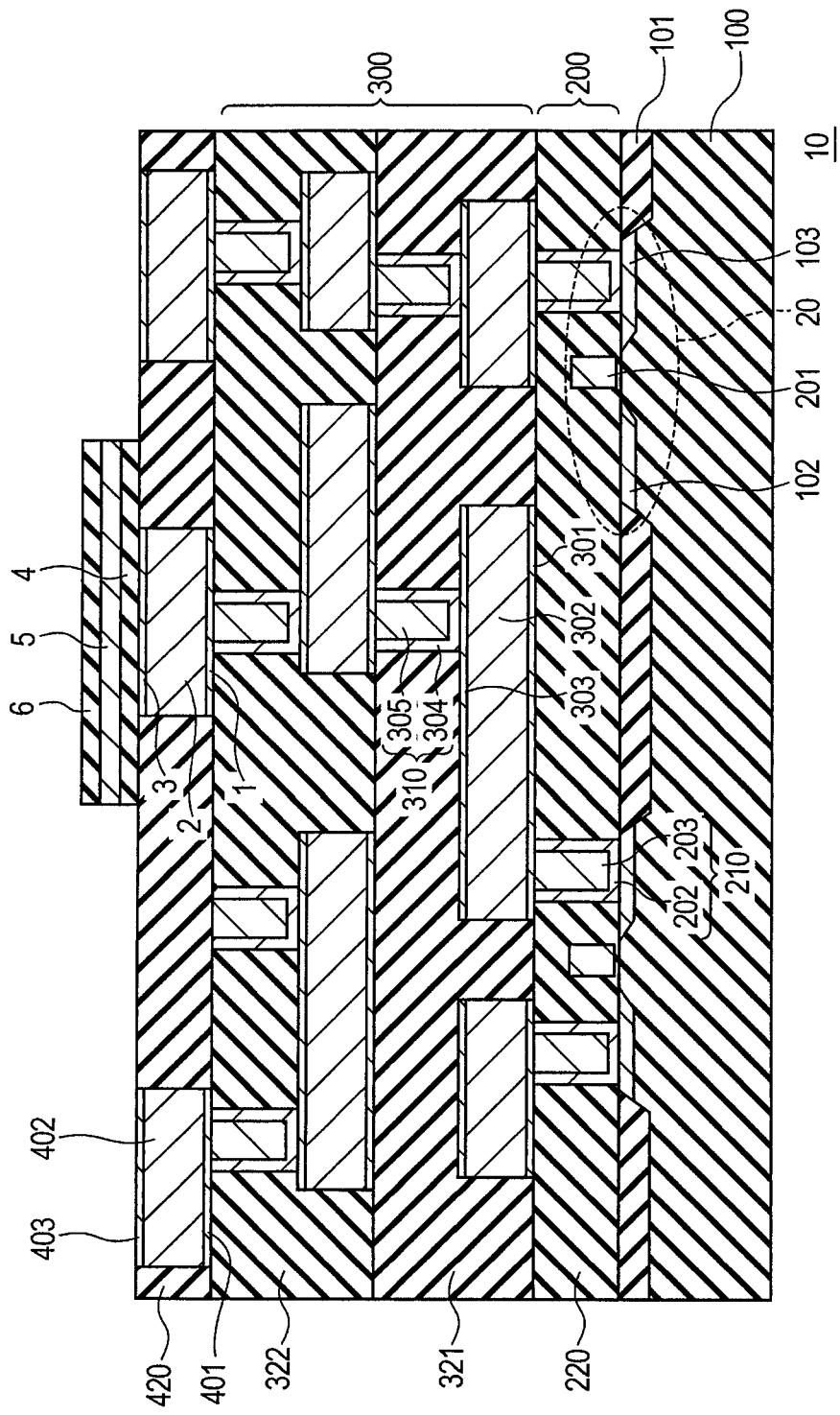
FIG. 4D is a view showing an example of a method for manufacturing a semiconductor device shown in FIG. 2 or 3.

In FIG. 4D, a stacked structure comprising the gate insulation film 4, the semiconductor layer 5, and the hard mask insulation film 6 is formed over the antireflection film 3 functioning as a gate electrode by etching the insulation films 64 and 65 with the hard mask insulation film 6 used as a mask. As the etching treatment for forming the stacked structure comprising the gate insulation film 4, the semiconductor layer 5, and the hard mask insulation film 6 for example, dry etching using any one of Cl$_2$, BCl$_3$, and N$_2$ or a mixed gas of those is preferably used. In the present embodiment, since the gate insulation film 4 and the semiconductor layer 5 are formed by processing the insulation films 64 and 65 by dry etching with the hard mask insulation film 6 used as the mask, it is possible to microfabricate the semiconductor layer 5 while the semiconductor characteristics are prevented from losing.

Figure 4E:
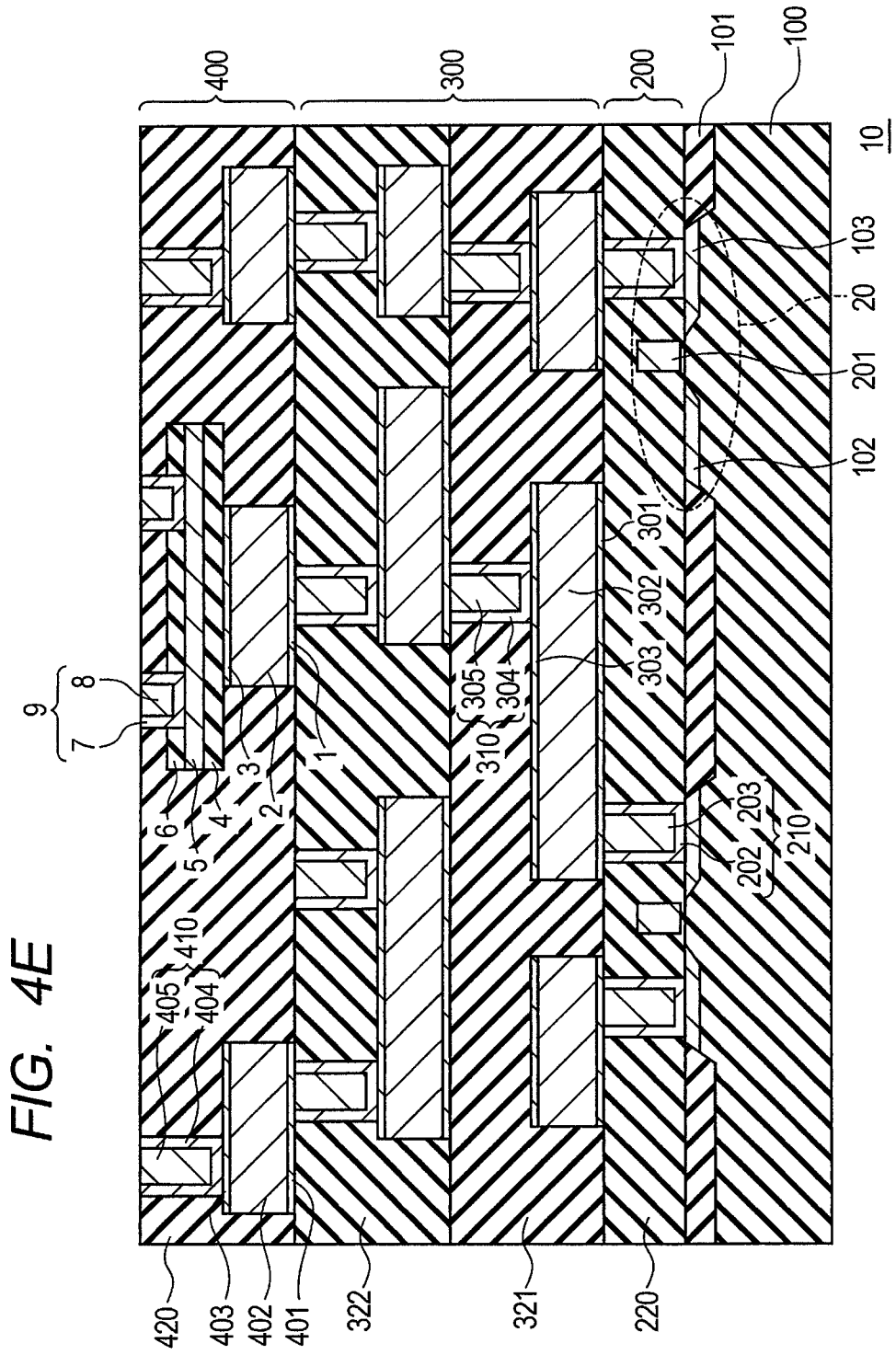
FIG. 4E is a view showing an example of a method for manufacturing a semiconductor device shown in FIG. 2 or 3.

Successively, in FIG. 4E, a via 410 coupled to the laminated wire (antireflection film 401/wire 402/antireflection film 403) and a contact 9 coupled to the semiconductor layer 5 are formed. Specifically, an interlayer insulation film 420 (for example $SiO_2$) is: stacked over the surface of the interlayer insulation film 420 shown in FIG. 4D, the antireflection film 403, and the hard mask insulation film 6; and removed partially and flattened by CMP. Successively, a via hole (contact hole) is formed at a given location (for example, over a location coming to be a source region and a drain region in the semiconductor layer 5 and a wire) by patterning treatment. Here, it is desirable that the via hole (contact hole) is formed by fluorine-system dry etching having a high selectivity to the hard mask insulation film 6. Successively, a film of a barrier metal material is formed by applying sputtering to the via hole and the contact hole and a film of a via plug material is formed by a CVD method. Successively, the surface is flattened by removing the barrier metal material and the via plug material over the surface by CMP. By so doing, the via 410 and the contact 9 are exposed on the surface and a third wiring layer 400 where a bottom gate type transistor 11 is formed is formed.

A wiring layer 500 is formed over the third wiring layer 400 through an ordinary Al wiring process in the same manner as the wiring layer 300. By so doing, a semiconductor device 10 shown in FIG. 2 is formed.

An example of a method for manufacturing a semiconductor device 10 shown in FIG. 3 is explained hereunder. The processes from FIG. 4A to FIG. 4D are the same as stated earlier and thus the explanations are omitted. When a semiconductor device 10 shown in FIG. 3 is formed, a treatment of embedding a wire is applied in succession to the process shown in FIG. 4D. Specifically, an interlayer insulation film 420 (for example $SiO_2$) is: stacked over the surface of the interlayer insulation film 420 shown in FIG. 4D, the antireflection film 403, and the hard mask insulation film 6; and removed partially and flattened by CMP. Successively, a via hole (contact hole) is formed at a given location (for example, over a location coming to be a source region and a drain region in the semiconductor layer 5 and a wire) by patterning treatment. Here, it is desirable that the via hole (contact hole) is formed by fluorine-system dry etching having a high selectivity to the hard mask insulation film 6. Successively, films are formed with a barrier metal material and a wiring material in sequence by applying sputtering to the via hole and the contact hole (not shown in the figure). Embedded wires 16 and 530 are formed over the surface of the films formed with the wiring material and the like by patterning of masking treatment and etching treatment.

The structures of the wiring layers 500 shown in FIGS. 2 and 3 can arbitrarily be selected in accordance with the locations (for example, whether or not an uppermost wiring layer) of the wiring layers 500, a wiring width, and others.

As stated above, by a semiconductor device 10 according to the present embodiment, since an antireflection film 3 (for example TiN) of an Al wire is used as a gate electrode, it is possible to apply $Al_2O_3$, $SiO_2$, or a gate stacked structure of $Al_2O_3/SiO_2$ to a wiring layer as a gate insulation film of an active element formable in the wiring layer. In the case of an active element structure using a Cu wire as a back gate electrode (bottom gate electrode) for example, by restriction on the necessity of using a wiring cap insulation film (SiN, SiCN) as a gate insulation film, the improvement of transistor characteristics and device reliability is also restricted. On the other hand, in the case of adopting a structure according to the present embodiment, by using $Al_2O_3$ of a high-k material having a small trap charge, $SiO_2$ having few H defects, or the like, it is possible to improve transistor characteristics. For example, the effects of reducing gate leakage, suppressing threshold shift, and improving threshold control, an on-off ratio, and device voltage resistance can be expected.

2. Second Embodiment

Figure 5:
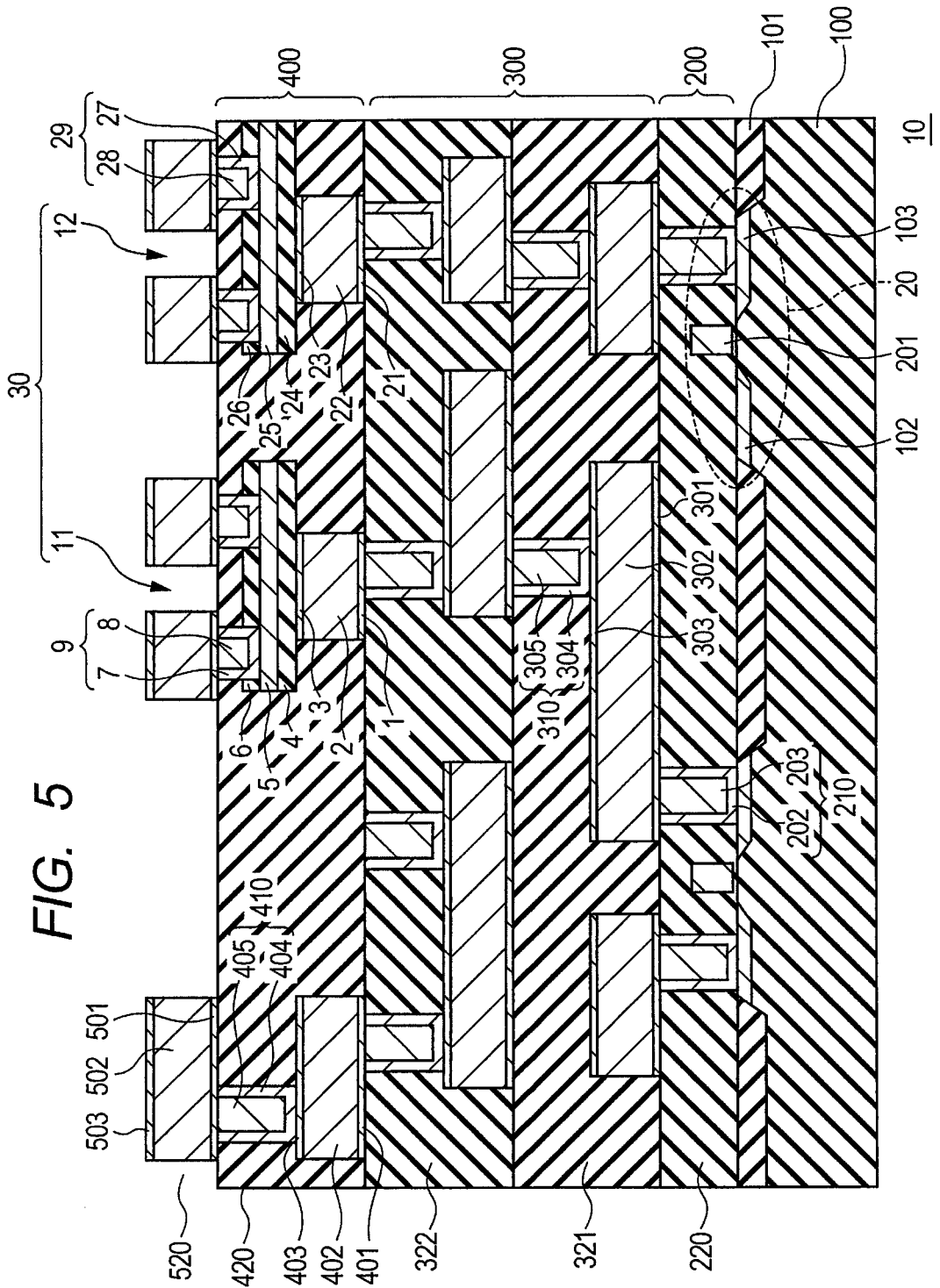
FIG. 5 is a view showing an example of the configuration of a semiconductor device according to Second Embodiment.

A bottom gate type transistor 11 shown in First Embodiment may form a logic circuit together with another bottom gate type transistor formed in a wiring layer. For example, as shown in FIG. 5, a CMOS (Complementary Metal Oxide Semiconductor) circuit 30 can be formed with a bottom gate type transistor 11 of a P-channel type and a bottom gate type transistor 12 of an N-channel type. The configuration of a semiconductor device 10 according to Second Embodiment of the present invention is explained in detail in reference to FIG. 5. In FIG. 5, a semiconductor device 10 according to Second Embodiment has an underlying logic element 20 formed over a substrate 100, a plurality of wiring layers 200, 300, 400, and 500, and a CMOS circuit 30 (also called a wiring layer active element) formed in the wiring layer 400.

Here, the bottom gate type transistor 11 is a P-channel type transistor and the bottom gate type transistor 12 is an N-channel type transistor. Although it is not shown in the figure, gates of the bottom gate type transistors 11 and 12 are coupled to each other and drains of the bottom gate type transistors 11 and 12 are coupled to each other.

The structure ranging from the substrate 100 to the second wiring layer 300 shown in FIG. 5 is the same as the structure shown in FIG. 2. Further, the structure of a bottom gate type transistor other than the bottom gate type transistor 12 formed in the third wiring layer 400 (for example, the bottom gate type transistor 11) is the same as the structure shown in FIG. 2 and hence the explanations are omitted.

In FIG. 5, the bottom gate type transistor 12 has a laminated wire (antireflection film 21/wire 22/antireflection film 23) functioning as a gate wire, a gate insulation film 24, a semiconductor layer 25, a hard mask insulation film 26, and contacts 29 (barrier metals 27/contact plugs 28). The two contacts 29 couple a source region and a drain region in the semiconductor layer 25 respectively to a wire (antireflection film 501/wire 502/antireflection film 503) in the fourth wiring layer 500.

The differences in configuration between the bottom gate type transistor 11 and the bottom gate type transistor 12 are that the conductivity type is different between a semiconductor layer 5 and the semiconductor layer 25 and the material (structure) is different between a gate insulation film 4 and the gate insulation film 24. Other structures than the above structures are the same between the bottom gate type transistors 11 and 12. Here, the gate insulation film 4 and the gate insulation film 24 may comprise an identical material (structure).

Figure 6A:
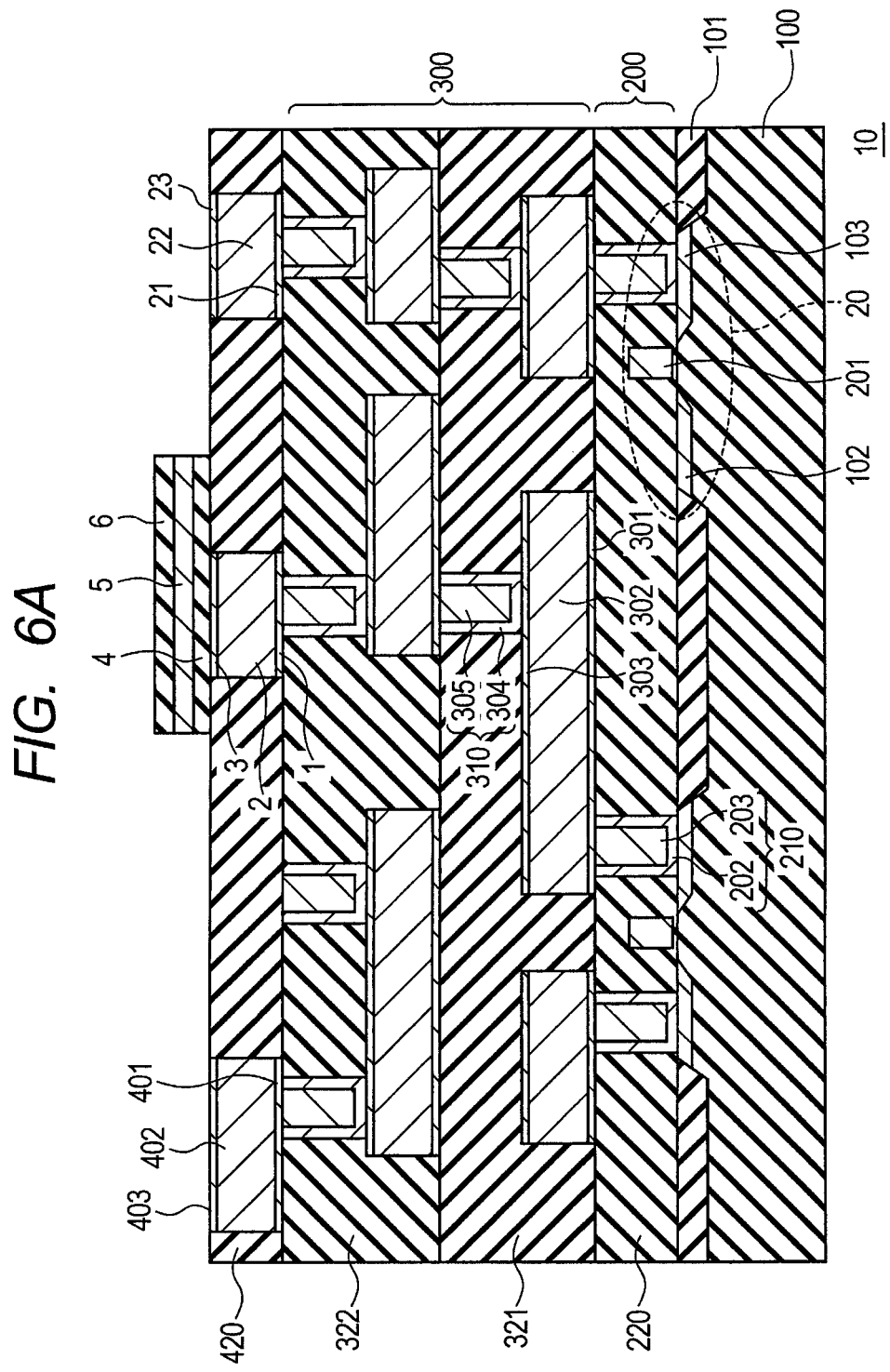
FIG. 6A is a view showing an example of a method for manufacturing a semiconductor device shown in FIG. 5.
Figure 6B:
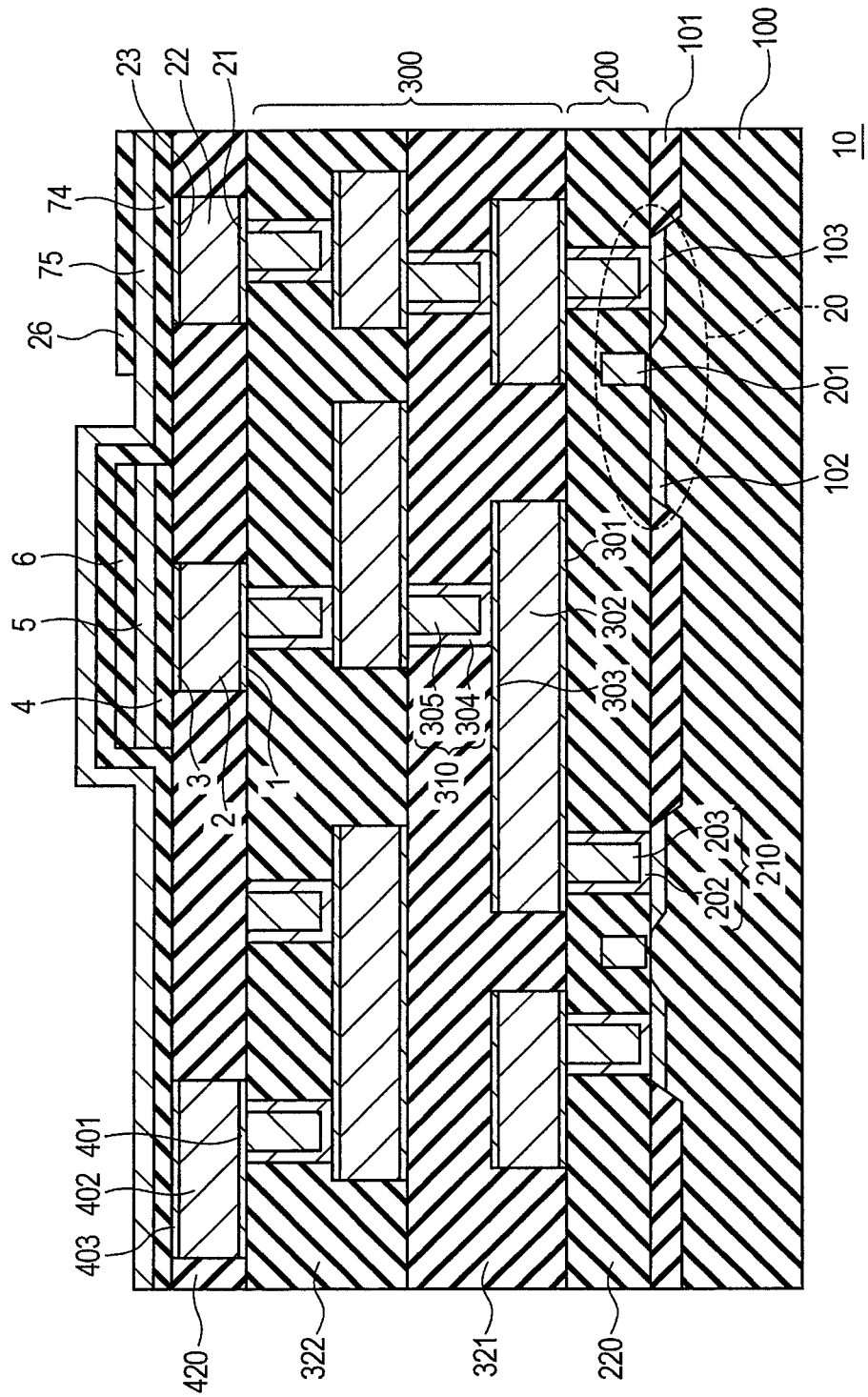
FIG. 6B is a view showing an example of a method for manufacturing a semiconductor device shown in FIG. 5.
Figure 6C:
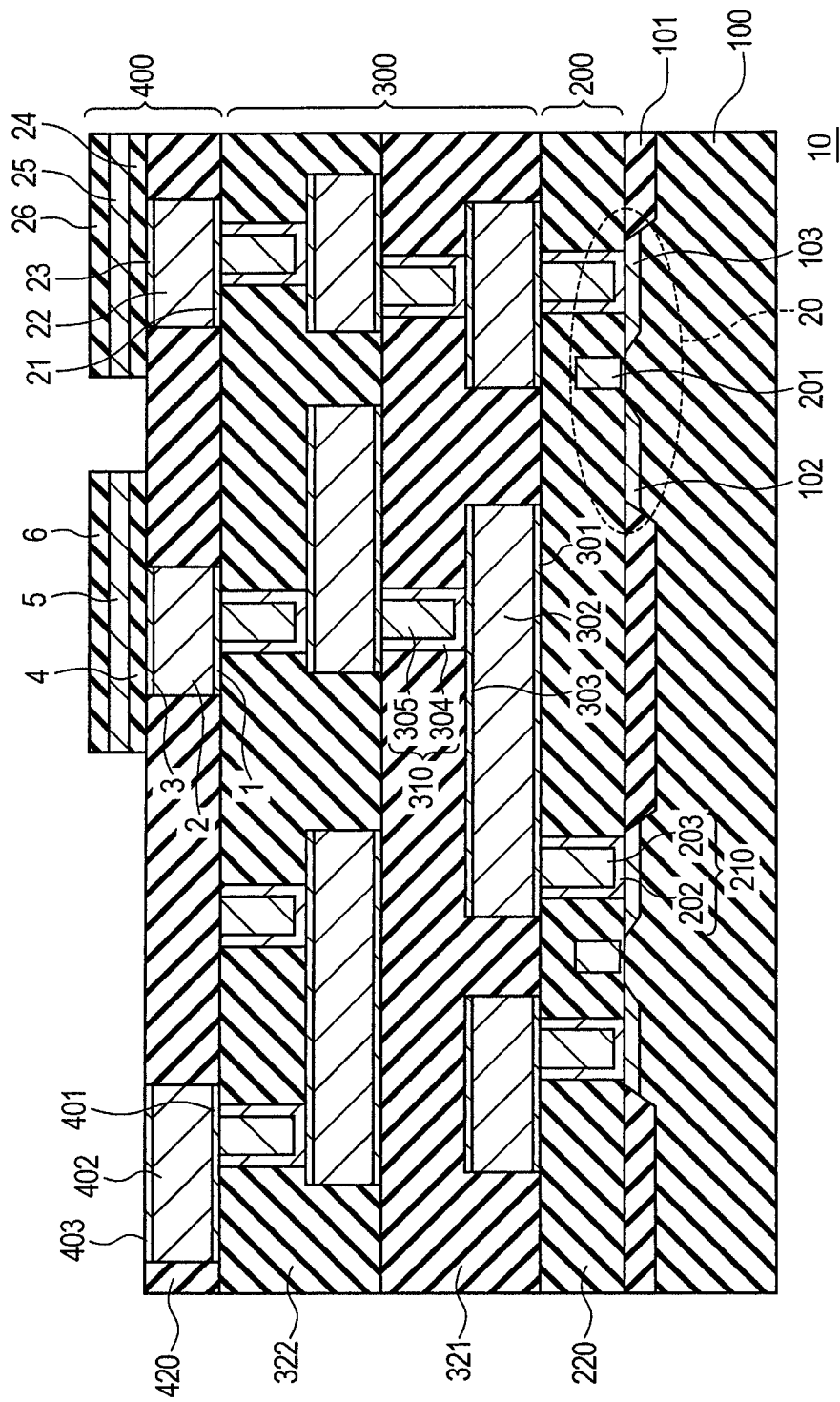
FIG. 6C is a view showing an example of a method for manufacturing a semiconductor device shown in FIG. 5.

An example of a method for manufacturing a semiconductor device 10 according to Second Embodiment shown in FIG. 5 is hereunder explained in reference to FIGS. 6A to 6C.

In FIG. 6A, an underlying logic element 20, a first wiring layer 200, and a second wiring layer 300 are formed by a method (an ordinary manufacturing process) similar to First Embodiment.

Successively, a laminated wire (antireflection film 401/wire 402/antireflection film 403) and gate wires (antireflection film 1/wire 2/antireflection film 3) and (antireflection film 21/wire 22/antireflection film 23) of a laminated structure are formed over the second wiring layer 300 through a wiring process similar to First Embodiment. In the example, the gate wire (antireflection film 1/wire 2/antireflection film 3) and the gate wire (antireflection film 21/wire 22/antireflection film 23) are coupled to each other at a location not shown in the figure. An interlayer insulation film 420 (for example SiO$_2$) is: formed over the laminated wire (antireflection film 401/wire 402/antireflection film 403) and the gate wires (antireflection film 1/wire 2/antireflection film 3) and (antireflection film 21/wire 22/antireflection film 23); and removed partially and flattened by CMP. By so doing, the antireflection films 3, 13, and 403 (TiN) are exposed on the outermost surface. In Second Embodiment too, it is possible to form the laminated wire and the gate wires simultaneously with an identical material through an Al wiring process similar to First Embodiment. A stacked structure comprising a gate insulation film 4, a semiconductor layer 5, and a hard mask insulation film 6 is formed over the flattened and exposed antireflection film 3 by a method similar to First Embodiment (refer to FIG. 4D).

In FIG. 6B, insulation films 74 and 75 are formed in sequence from the lower layer over the surfaces of the antireflection films 23 and 403, the interlayer insulation film 420, and the hard mask insulation film 6 by a sputtering method, a CVD method, a coating method, or the like. The insulation film 74 comes to be a gate insulation film 24 through a subsequent etching process and hence comprises a material identical to the aforementioned gate insulation film 24. Likewise, the insulation film 75 comes to be a semiconductor layer 25 through a subsequent etching process and hence comprises a material identical to the aforementioned semiconductor layer 25.

Successively, a pattern-formed hard mask insulation film 26 is formed over the insulation film 75. A silicon-contained dielectric material (for example, any one of SiN, SiO$_2$, and SiCOH or a laminated structure of those) is preferably used as the hard mask insulation film 26. Here, when the semiconductor layer 25 is an oxide semiconductor such as InGaZnO, InZnO, ZnO, ZnAlO, or ZnCuO for example, it is desirable to stabilize the oxidation state of the surface of the semiconductor layer 25 by plasma treatment that introduces an oxidizing gas such as N$_2$O before the hard mask insulation film 26 is formed.

In FIG. 6C, a stacked structure comprising the gate insulation film 4, the semiconductor layer 5, and the hard mask insulation film 6 is formed over the antireflection film 3 functioning as a gate electrode of the transistor 11 and a stacked structure comprising the gate insulation film 24, the semiconductor layer 25, and the hard mask insulation film 26 is formed over the antireflection film 23 functioning as a gate electrode of the transistor 12 by etching the insulation films 64, 65, 74, and 75 with the hard mask insulation films 6 and 26 used as masks. As the etching treatment for forming such a stacked structure for example, dry etching using any one of Cl$_2$, BCl$_3$, and N$_2$ or a mixed gas of those is preferably used. In the present embodiment, since the gate insulation films 4 and 24 and the semiconductor layers 5 and 25 are formed by processing the insulation films 64, 65, 74, and 75 by dry etching with the hard mask insulation films 6 and 26 used as the masks, it is possible to microfabricate the semiconductor layers 5 and 25 while the semiconductor characteristics are prevented from losing.

Successively, in FIG. 5, a via 410 coupled to a laminated wire (antireflection film 401/wire 402/antireflection film 403), a contact 9 coupled to the semiconductor layer 5, and a contact 29 coupled to the semiconductor layer 25 are formed. Specifically, an interlayer insulation film 420 (for example SiO2) is: stacked over the surface of the interlayer insulation film 420, the antireflection film 403, and the hard mask insulation films 6 and 26 shown in FIG. 6C; and removed partially and flattened by CMP. Successively, via holes (contact holes) are formed at given locations (for example, over locations coming to be source regions and drain regions and wires in the semiconductor layers 5 and 25 and wires) by patterning treatment. Here, it is desirable that the via holes (contact holes) are formed by fluorine-system dry etching having a high selectivity to the hard mask insulation films 6 and 26. Successively, a film of a barrier metal material is formed by applying sputtering to the via holes and the contact holes and a film of a via plug material is formed by a CVD method. Successively, the barrier metal material and the via plug material over the surface are removed by CMP and thereby the surface is flattened. By so doing, the via 410 and the contacts 9 and 29 are exposed on the surface and a third wiring layer 400 in which the bottom gate type transistors 11 and 12 are formed is formed. A laminated wire is formed over the contacts 9 and 29 through a wiring process similar to First Embodiment over the third wiring layer 400. In the present example, a wire over the contact 9 coupled to the drain region in the semiconductor layer 5 and a wire over the contact 29 coupled to the drain region in the semiconductor layer 25 are coupled to each other at a location not shown in the figure.

As stated above, in a semiconductor device 10 according to the present embodiment, it is possible to form a logic circuit (for example, a CMOS circuit 30) having a plurality of bottom gate type transistors 11 and 12 formed simultaneously in an identical wiring layer.

A semiconductor device 10 according to the present embodiment also uses antireflection films 3 and 23 (for example TiN) for an Al wire as gate electrodes in the same manner as First Embodiment and hence the selectivity of a gate insulation film of a logic circuit capable of being formed in a wiring layer improves. As a result, in a semiconductor device 10 according to the present embodiment, the effects of improving transistor characteristics in a logic circuit, such as the effects of reducing gate leakage, suppressing threshold shift, and improving threshold control, an on-off ratio, and device voltage resistance, can be expected.

Although the configuration of forming two bottom gate type transistors 11 and 12 in an identical wiring layer is shown in the example shown in FIG. 5 here, the present invention is not limited to the configuration and it is also possible to form a plurality of bottom gate type transistors in another wiring layer. Further, although explanations are made by using a CMOS circuit as the example in the present embodiment, it goes without saying that the present invention can be applied to another logic circuit (for example, a transfer gate, a logical operation circuit such as an AND circuit, an NAND circuit, an OR circuit, or an NOR circuit, or a memory cell such as an SRAM or a DRAM) as long as a bottom gate type transistor formed in a wiring layer can be used.

Figure 7:
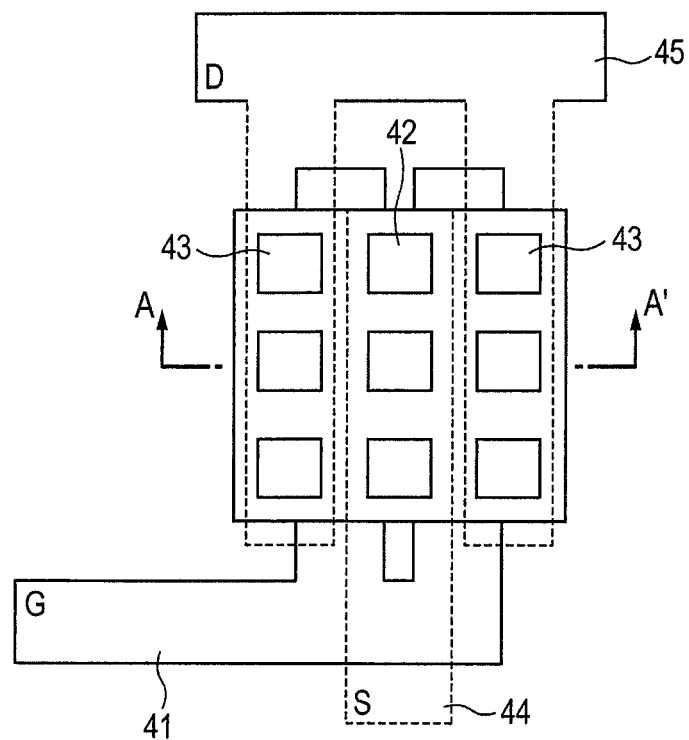
FIG. 7 is a view showing the planar structure of a bottom gate type transistor according to an embodiment.
Figure 8:
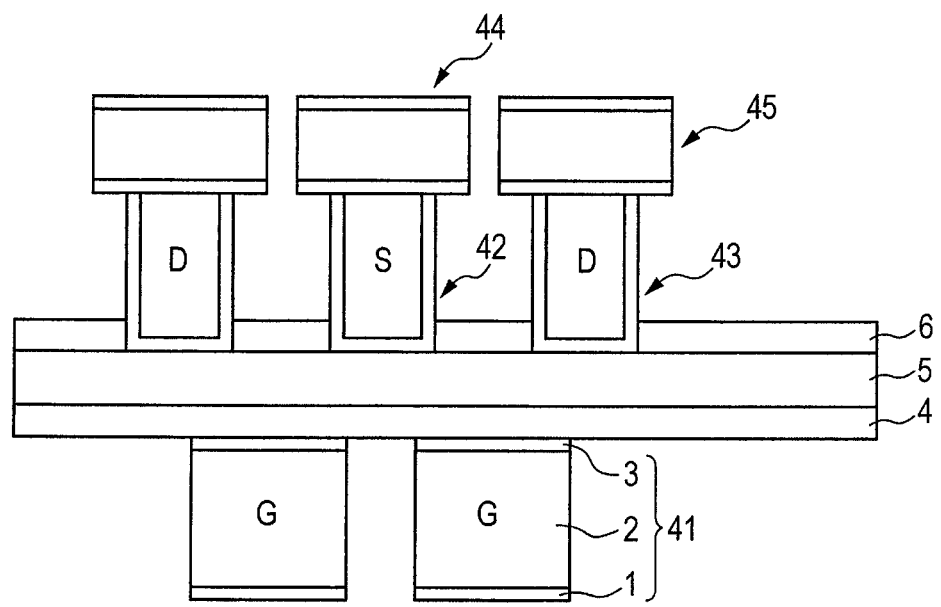
FIG. 8 is a view showing the cross-sectional structure taken on line A-A' of a bottom gate type transistor shown in FIG. 7.

An example of the planar structure of a bottom gate type transistor 11 according to the present embodiment is hereunder explained in reference to FIGS. 7 and 8. FIG. 7 is a view showing the planar structure of a bottom gate type transistor 11 according to an embodiment. FIG. 8 is a view showing the cross-sectional structure of the bottom gate type transistor 11 taken on line A-A' in FIG. 7.

The example of the planar structure shown in FIG. 7 shows a pectinate gate structure and it can be driven effectively at a large current even in a small area. Hereinafter, a gate wire (antireflection film 1/wire 2/antireflection film 3) of the bottom gate type transistor 11 is referred to as a gate wire 41, a contact 9 coupled to a source region of a semiconductor layer 5 is referred to as a source contact 42, and a contact 9 coupled to a drain region of the semiconductor layer 5 is referred to as a drain contact 43. Further, an upper layer wire coupled to the source contact 42 is referred to as a source wire 44 and an upper layer wire coupled to the drain contact 43 is referred to as a drain wire 45.

In FIGS. 7 and 8, the drain wire 45 shows a pectinate shape and has a plurality of wires (hereunder referred to as drain pectinate wires) extending from one wire in the direction perpendicular to the wire. The source wire 44 is formed between the plural drain pectinate wires in a planar view and extends in parallel with the pectinate wires. The gate wire 41 shows a pectinate shape and has a plurality of wires (hereunder referred to as gate pectinate wires) extending from one wire in the direction perpendicular to the wire. The gate pectinate wires are formed between the drain pectinate wires and the source wire 44 in a planar view and extend in parallel with the drain pectinate wires and the source wire 44.

A plurality of source contacts 42 are formed so as to couple the source wire 44 to the semiconductor layer 5 and a plurality of drain contacts 43 are formed so as to couple the drain pectinate wires in the drain wire 45 to the semiconductor layer 5.

By the above configuration, it is possible to: densely form the gate wire, the source contacts 42, and the drain contacts of the bottom gate type transistor 11; and effectively increase on-site current per area. By so doing, it is possible to materialize area reduction and a high on-site current and obtain a downsized high-performance wiring switch.

Figure 9:
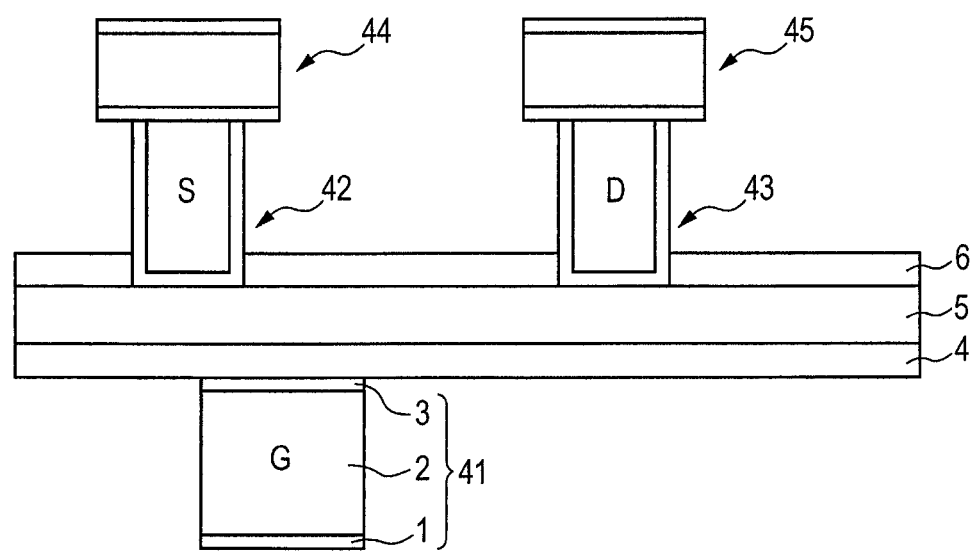
FIG. 9 is a view showing an example of the structure (high-voltage-resistant structure) of a bottom gate type transistor according to an embodiment.

FIG. 9 is a view showing an example of the structure (high-voltage-resistant structure) of a bottom gate type transistor according to an embodiment. In FIG. 9, it is possible to increase device voltage resistance by separating a gate wire 41 from a drain contact 43 at a given distance, namely by adopting an offset structure between a gate and a drain.

Figure 10:
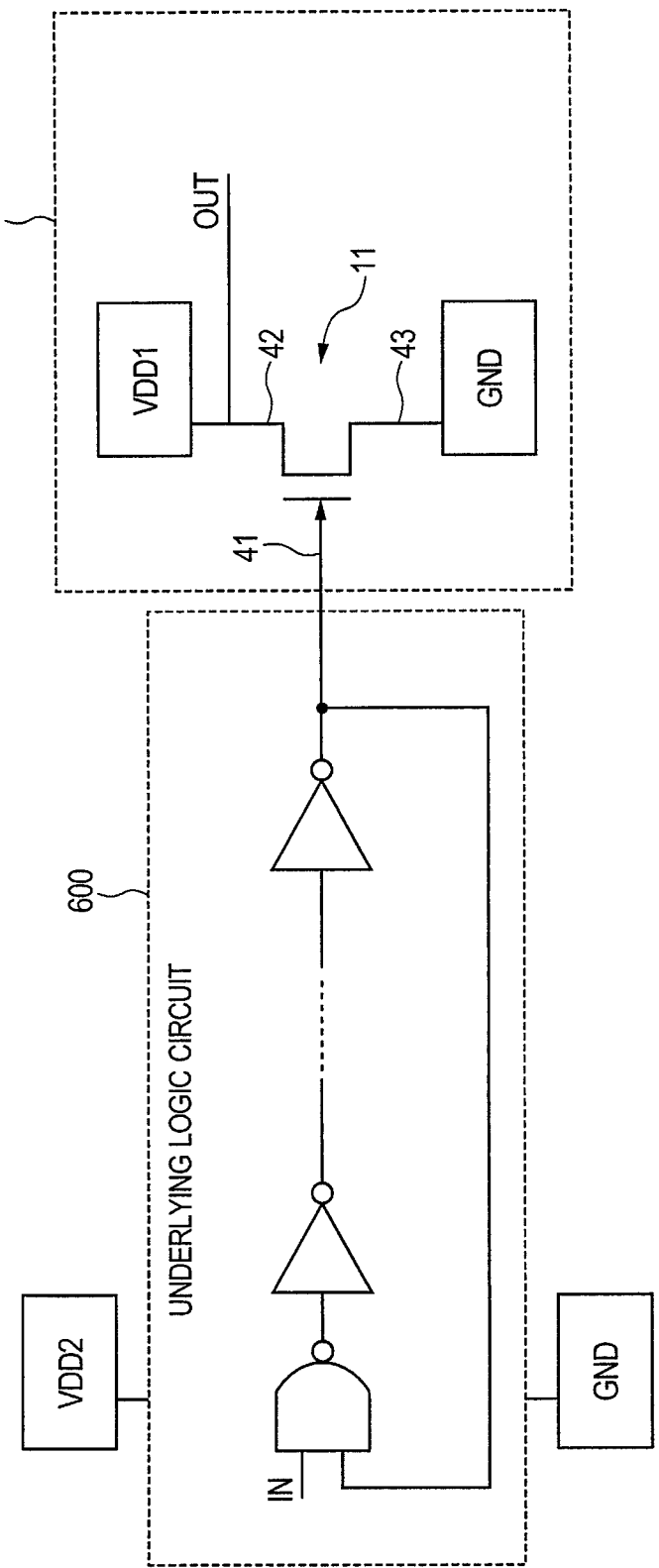
FIG. 10 is a view showing an example of the relation of connection between a wiring layer active element and an underlying logic circuit (Logic circuit formed on the semiconductor substrate) according to an embodiment.

An aforementioned wiring layer active element (for example, a bottom gate type transistor 11 or a CMOS circuit 30) is preferably coupled electrically to an underlying logic circuit including an underlying logic element 20. For example, a wiring layer active element (for example, a bottom gate type transistor 11 or a CMOS circuit 30) can be used as an I/O (Input/Output) signal switch or a power switch by being formed in a lower wiring layer of a signal pad or a power pad. FIG. 10 shows an example of using a wiring layer active element 11 as an output signal switch, FIG. 11 shows an example using a wiring layer active element 11 as an input signal switch, and FIG. 12 shows an example of using a wiring layer active element as a power switch.

FIG. 10 is a view showing an example of the relation of connection between a wiring layer active element and an underlying logic circuit according to an embodiment. Here, a circuit comprising an underlying logic element 20 is referred to as an underlying logic circuit 600 and a circuit having a wiring layer active element 11 is referred to as a wiring layer circuit 700. A wiring layer active element 11 is formed in a wiring layer and hence a power-supply voltage VDD1 (for example 12V) different from a power-supply voltage VDD2 (for example 3V) supplied to the underlying logic circuit 600 can be supplied. The underlying logic circuit 600 in the present example operates in response to the power-supply voltage VDD2 supplied from a second power source and has an NAND circuit and a clock tree circuit including a plurality of inverter circuits. An output signal of the underlying logic circuit 600 is inputted into a gate wire 41 of the wiring layer active element 11. A source wire 44 of the wiring layer active element 11 is coupled to a first power source (power-supply voltage VDD1) and an output signal wire OUT and a drain wire 45 is coupled to a third power source (for example GND).

By such a configuration, the wiring layer circuit 700 operates as an output signal switch to control the transmission of a signal from the underlying logic circuit 600 to the output signal wire OUT. The wiring layer circuit 700 is formed in a wiring layer over the underlying logic circuit 600 and hence it is possible to consolidate the underlying logic circuit 600 operating at a low power-supply voltage VDD2 and the wiring layer active element 11 operating at a high power-supply voltage VDD1 in an identical chip. By a semiconductor device 10 according to the present embodiment therefore, it is possible to materialize a circuit configuration to control the output of an underlying logic circuit 600 of a low operating voltage with a wiring layer circuit 700 of a high operating voltage while a chip area is prevented from increasing. Further, a wiring layer circuit 700 is formed in a wiring layer over an underlying logic circuit 600 and hence it is possible to change the disposition of an output signal switch to control an output signal coming from the underlying logic circuit 600 and the access point of the output signal by changing the layout of the wiring layer without changing the layout of the underlying logic circuit 600. By so doing, it is possible to avoid a turn-back process related to the modification of the underlying logic circuit 600 and reduce design time significantly.

Figure 11:
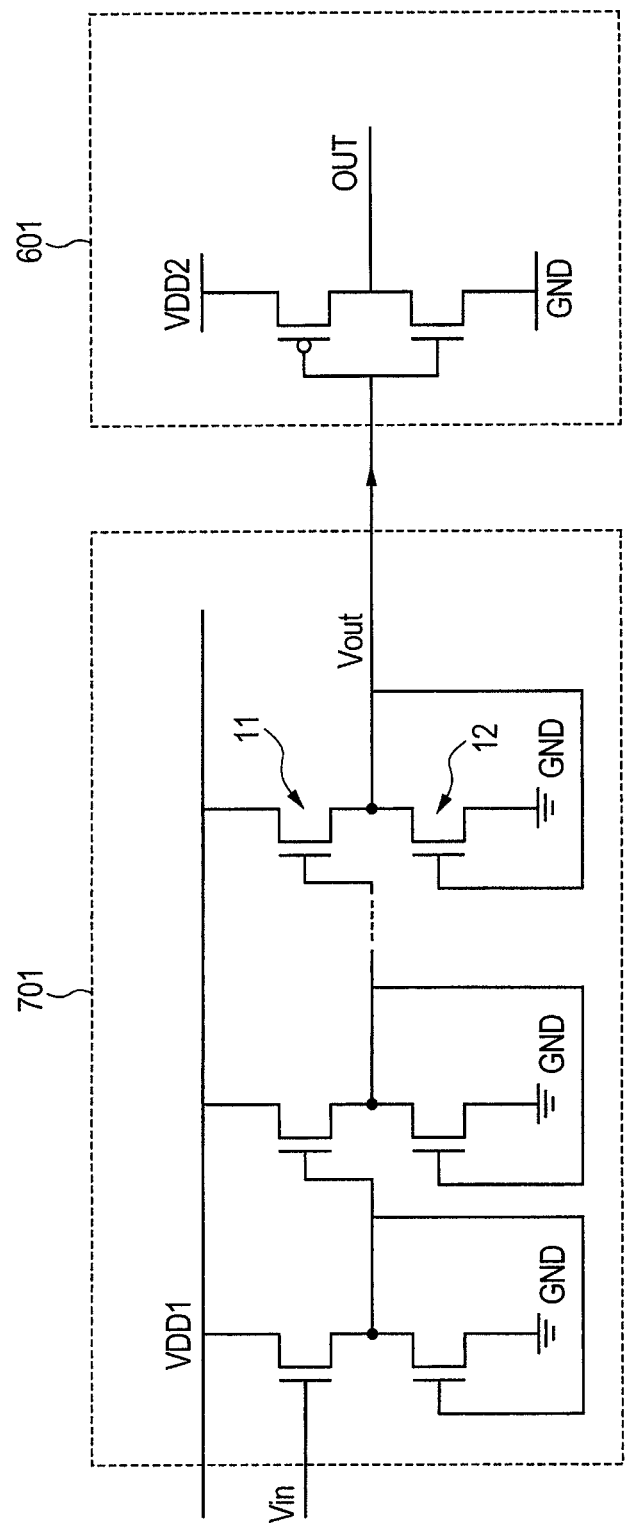
FIG. 11 is a view showing another example of the relation of connection between a wiring layer active element and an underlying logic circuit according to an embodiment.
Figure 12:
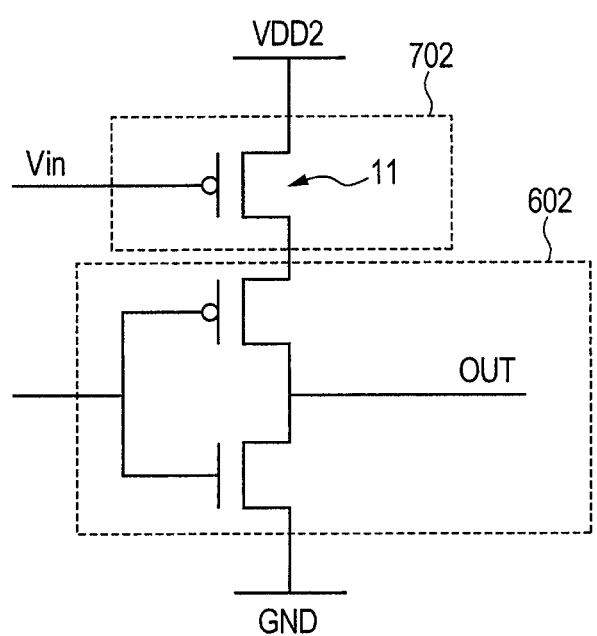
FIG. 12 is a view showing still another example of the relation of connection between a wiring layer active element and an underlying logic circuit according to an embodiment.

FIG. 11 is a view showing another example of the relation of connection between a wiring layer active element and an underlying logic circuit according to an embodiment. Here, a circuit comprising an underlying logic element 20 is referred to as an underlying logic circuit 601 and a circuit having wiring layer active elements 11 and 12 is referred to as a wiring layer circuit 701. The wiring layer active elements 11 and 12 are formed in a wiring layer and hence a power-supply voltage VDD1 (for example 12V) different from a power-supply voltage VDD2 (for example 3V) supplied to the underlying logic circuit 601 can be supplied. The underlying logic circuit 601 in the present example has an inverter circuit operating in response to the power-supply voltage VDD2 supplied from a second power source. The wiring layer circuit 701 has a plurality of signal control circuits each of which includes the wiring layer active element 11 in which a source is coupled to a first power source (power-supply voltage VDD1) and a gate is coupled to an input signal wire and the wiring layer active element 12 in which a source is coupled to a third power source (GND) and a gate is coupled to an output signal wire. Here, drains of the wiring layer active elements 11 and 12 and a gate of the wiring layer active element 12 are coupled to an output signal wire (an input signal wire of the next stage). An output signal wire VOUT in a signal control circuit at the final stage of the wiring layer circuit 701 is coupled to an input terminal of the inverter circuit in the underlying logic circuit 601.

By such a configuration, the wiring layer circuit 701 operates as an input signal switch to control the transmission of an input signal (voltage Vin) to the underlying logic circuit 601. In the same way as described above, the wiring layer circuit 701 is formed in a wiring layer over the underlying logic circuit 601 and hence it is possible to consolidate the underlying logic circuit 601 operating at a low power-supply voltage VDD2 and the wiring layer active element 11 operating at a high power-supply voltage VDD1 in an identical chip. By a semiconductor device 10 according to the present embodiment therefore, it is possible to materialize a circuit configuration to control an input into an underlying logic circuit 601 of a low operating voltage with a wiring layer circuit 701 of a high operating voltage while a chip area is prevented from increasing. Further, a wiring layer circuit 701 is formed in a wiring layer over an underlying logic circuit 601 and hence it is possible to change the disposition of an input signal switch to control an input signal to the underlying logic circuit 601 and the access point of the input signal by changing the layout of the wiring layer without changing the layout of the underlying logic circuit 601. By so doing, it is possible to avoid a turn-back process related to the modification of the underlying logic circuit 601 and reduce design time significantly.

FIG. 12 is a view showing still another example of the relation of connection between a wiring layer active element and an underlying logic circuit according to an embodiment. Here, a circuit comprising an underlying logic element 20 is referred to as an underlying logic circuit 602 and a circuit having a wiring layer active element 11 is referred to as a wiring layer circuit 702. The underlying logic circuit 602 according to the present example has an inverter circuit operating in response to a power-supply voltage VDD2 supplied from a second power source through the wiring layer circuit 702. Specifically, the wiring layer circuit 702 has a P-channel type bottom gate type transistor 11 in which a source is coupled to the second power source (power-supply voltage VDD2) and a drain is coupled to a power wire of the underlying logic circuit 602. The underlying logic circuit 602 has an inverter circuit comprising a P-channel type transistor in which a source is coupled to the drain of the bottom gate type transistor 11 and an N-channel type transistor in which a source is coupled to a third power source (GND).

By such a configuration, the wiring layer circuit 702 controls connection between the second power source (power-supply voltage VDD2) and the underlying logic circuit 602 in response to a voltage Vin inputted into a gate of the wiring layer active element 11. That is, the wiring layer circuit 702 functions as a power switch to control the supply of the power-supply voltage VDD2 to the underlying logic circuit 602. The wiring layer circuit 702 is formed in a wiring layer over the underlying logic circuit 602 and hence it is possible to change the disposition of the power switch to control power supply to the underlying logic circuit 602 and the supply destination of electric power by changing the layout of the wiring layer without changing the layout of the underlying logic circuit 602. By so doing, it is possible to avoid a turn-back process related to the modification of the underlying logic circuit 602 and reduce design time significantly.

The wiring layer circuits 700, 701, and 702 are not limited to the aforementioned circuit configurations as long as they are circuits including the wiring layer active elements (bottom gate type transistors 11 and 12 and CMOS circuits 30) shown in the present embodiments. Further, the underlying logic circuits 600, 601, and 602 are not limited to the aforementioned circuit configurations as long as they have underlying logic elements 20 controlled by the wiring layer circuits 700, 701, and 702.

As stated above, by a semiconductor device 10 according to the above embodiments, it is possible to arbitrarily select the type of a gate insulation film by using an antireflection film (cap film) formed through an Al wiring process as a gate wire. As a result, it is possible to improve process margin related to the improvement of characteristics.

Although embodiments according to the present invention have heretofore been described in detail, a concrete configuration is not limited to the embodiments and any modification is included in the present invention as long as the modification is in a range not deviating from the tenor of the present invention. First Embodiment and Second Embodiment can be incorporated with each other in a technologically possible range. Further, it is also possible to form wiring layer active elements 11, 12, and 30 through an Al wiring process and form another wiring layer and an underlying logic element 20 through a Cu wiring process and thus form a semiconductor device.

Figure 13:
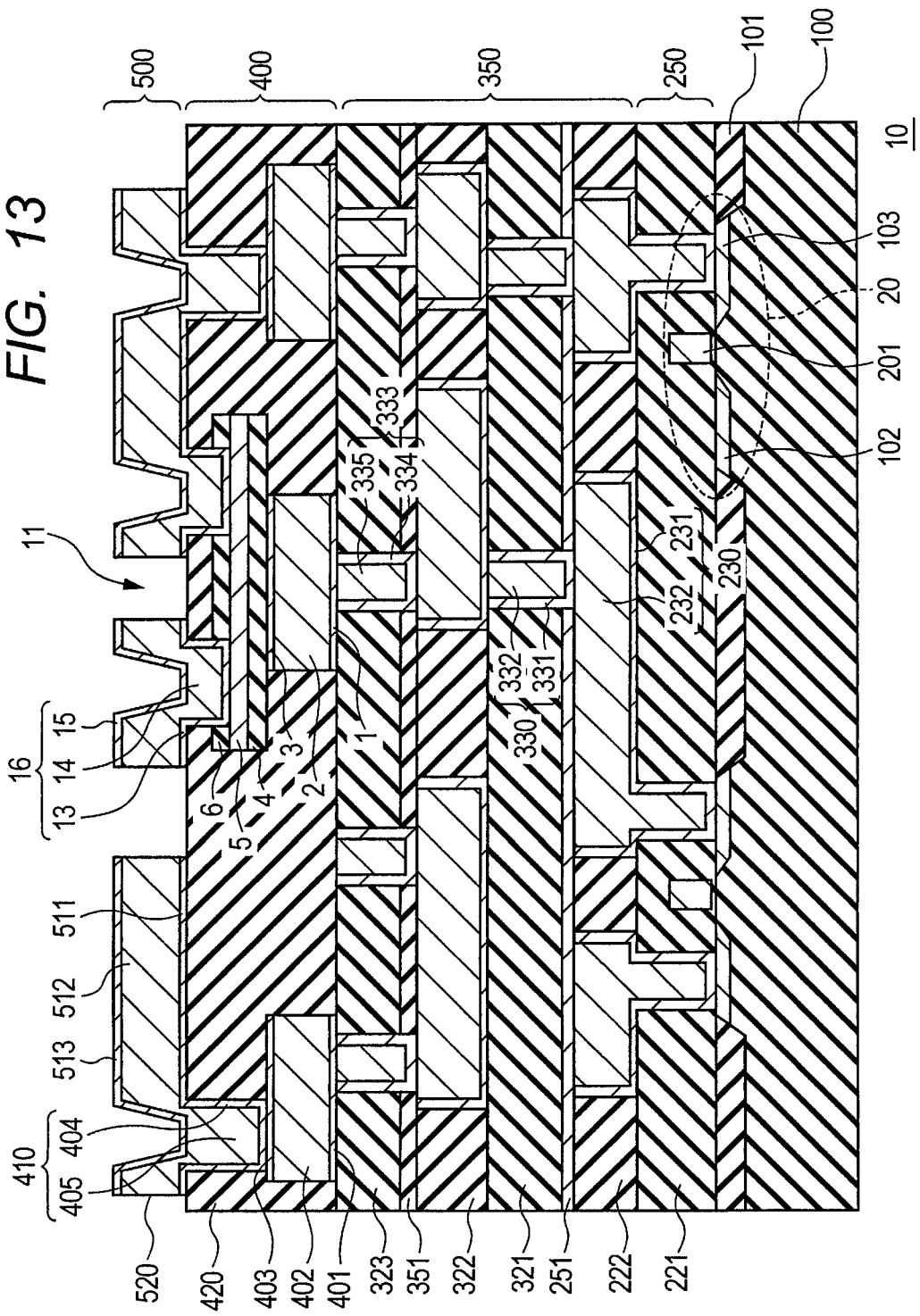
FIG. 13 is a view showing an example of the configuration of a semiconductor device consolidating a wiring layer formed through an Al wiring process and a wiring layer formed through a Cu wiring process.

FIG. 13 is a view showing an example of the configuration of a semiconductor device 10 consolidating a wiring layer formed through an Al wiring process and a wiring layer formed through a Cu wiring process. In FIG. 13, a semiconductor device 10 of the present example has an underlying logic element 20 formed over a substrate 100, a plurality of wiring layers 250, 350, 400, and 500, and a bottom gate type transistor 11 (also called a wiring layer active element) formed in the wiring layer 400.

The first wiring layer 250 and the second wiring layer 350 over the substrate 100 are formed through a Cu wiring process, the configurations of the underlying logic element 20, the third wiring layer 400 including the bottom gate type transistor 11, and the fourth wiring layer 500 formed thereover are similar to the configuration shown in FIG. 3, and hence the explanations are omitted.

The first wiring layer 250 is formed over the underlying logic element 20. The underlying logic element 20 is coupled to another element, a power source, and the like through the first wiring layer 250. For example, the first wiring layer 250 has an embedded wire 230 to couple the underlying logic element 20 to the second wiring layer 350. The embedded wire 230 includes a barrier metal 231 (for example TiN) and a wire 232 containing Cu as the main component. The embedded wire 230 comprises a contact section embedded into an interlayer insulation film 221 formed over the underlying logic element 20 and a wiring section embedded into an interlayer insulation film 222 formed thereover. A diffusion prevention film 251 such as an SiCN film is formed over the embedded wire 230 and the interlayer insulation film 222.

The second wiring layer 350 has embedded wires 330 and 333 to couple the first wiring layer 250 to the third wiring layer 400. The embedded wire 330 includes a barrier metal 331 (for example TiN) and a wire 332 containing Cu as the main component. The embedded wire 330 is embedded into an interlayer insulation film 321 formed over the diffusion prevention film 251 and the diffusion prevention film 251 and comprises a contact section coupled to the embedded wire 230 and a wiring section embedded into an interlayer insulation film 322 thereover. A diffusion prevention film 351 such as an SiCN film is formed over the embedded wire 330 and the interlayer insulation film 322. The embedded wire 333 includes a barrier metal 334 (for example TiN) and a wire 335 containing Cu as the main component. The embedded wire 333 is embedded into an interlayer insulation film 323 formed over the diffusion prevention film 351 and the diffusion prevention film 351 and has a contact section coupled to the embedded wire 330.

The configurations of the third wiring layer 400 and the fourth wiring layer 500 are similar to FIG. 3 but an Al wire (antireflection film 401/wire 402/antireflection film 403) and a gate wire (antireflection film 1/wire 2/antireflection film 3) formed through an Al wiring process are formed over the embedded wire 333 so as to be coupled to the embedded wire 333.

The wiring layer 500 may either be materialized with an embedded wire 16 in the same manner as FIG. 3 or have a wiring structure similar to FIG. 2.

What is claimed is:
1. A semiconductor device, comprising:
   an underlying logic element formed over a substrate; and
   a bottom gate type transistor comprising a semiconductor layer, a gate insulation film under the semiconductor layer, and an antireflection film formed over an alumi- num wire as a gate electrode, the gate electrode being under the gate insulation film,
wherein the bottom gate type transistor is formed in a wiring layer formed over the underlying logic element and at least in part overlaps the underlying logic element.

2. The semiconductor device according to claim 1, wherein
the gate insulation film includes either of $Al_2O_3$ or $SiO_2$.

3. The semiconductor device according to claim 2,
wherein the bottom gate type transistor has an oxide semiconductor layer formed over the gate insulation film, and
the oxide semiconductor layer includes any one selected from the group consisting of InGaZnO, InZnO, ZnO, ZnAlO, and ZnCuO.

4. The semiconductor device according to claim 3,
wherein the semiconductor device further has a hard mask insulation film formed over the oxide semiconductor layer.

5. A semiconductor device according to claim 1,
wherein the semiconductor device further has another bottom gate type transistor using another antireflection film formed over another aluminum wire as a gate electrode, and
the another bottom gate type transistor is formed in a wiring layer formed over the underlying logic element and constitutes a CMOS (Complementary Metal Oxide Semiconductor) circuit together with the bottom gate type transistor.

6. A semiconductor device according to claim 1,
wherein the underlying logic element is coupled to another underlying logic element through a copper wire, and
the aluminum wire is coupled to the copper wire.

7. A semiconductor device according to claim 1,
wherein the bottom gate type transistor is coupled to a power wire through which a first power-supply voltage is supplied, and
the underlying logic element is coupled to a power wire through which a second power-supply voltage lower than the first power-supply voltage is supplied.

8. A semiconductor device according to claim 1,
wherein an output voltage of the underlying logic element is supplied to the gate electrode.

9. A semiconductor device according to claim 1,
wherein the semiconductor device has a logic circuit having the bottom gate type transistor, and
an output voltage of the logic circuit is supplied to an input terminal of the underlying logic element.

10. A semiconductor device according to claim 1,
wherein the bottom gate type transistor is coupled between a power wire and the underlying logic element and controls connection between the power wire and the underlying logic element on the basis of an input voltage supplied to the gate electrode.

11. The semiconductor device according to claim 1, wherein the antireflection film is a first antireflection film, and a second antireflection film is formed under the aluminum wire.

12. The semiconductor device according to claim 1, wherein the antireflection film is formed from TiN.

13. The semiconductor device according to claim 11, wherein the second antireflection film is formed from TiN.

14. The semiconductor device according to claim 1, wherein the semiconductor device comprises first, second and third wiring layers.

15. The semiconductor device according to claim 14, wherein the first wiring layer is formed over the underlying logic element and includes a contact plug.

16. The semiconductor device according to claim 14, wherein the second wiring layer is formed over the first wiring layer and includes a wire and antireflection films at interfaces between the wire and interlayer insulation films.

17. The semiconductor device according to claim 14, wherein the third wiring layer is formed over the second wiring layer and includes the bottom gate type transistor.

* * * * *